(12) United States Patent
Aritome

(10) Patent No.: US 9,042,177 B2
(45) Date of Patent: May 26, 2015

(54) SEMICONDUCTOR DEVICE AND METHOD OF OPERATING THE SAME

(71) Applicant: SK hynix Inc., Gyeonggi-do (KR)

(72) Inventor: Seiichi Aritome, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 14/092,698

(22) Filed: Nov. 27, 2013

(65) Prior Publication Data

US 2015/0023103 A1  Jan. 22, 2015

(30) Foreign Application Priority Data

Jul. 18, 2013  (KR) .................. 10-2013-0084685

(51) Int. Cl.
| | |
|---|---|
| G11C 16/04 | (2006.01) |
| G11C 16/16 | (2006.01) |
| G11C 16/26 | (2006.01) |
| G11C 16/24 | (2006.01) |
| G11C 16/10 | (2006.01) |

(52) U.S. Cl.
CPC .............. *G11C 16/04* (2013.01); *G11C 16/16* (2013.01); *G11C 16/26* (2013.01); *G11C 16/24* (2013.01); *G11C 16/10* (2013.01)

(58) Field of Classification Search
CPC .... G11C 16/0483; G11C 16/10; G11C 16/24; G11C 16/26; G11C 11/5628

USPC ............ 365/185.17, 185.18, 185.25, 185.24, 365/185.22, 185.03
See application file for complete search history.

(56) References Cited

U.S. PATENT DOCUMENTS

| | | | | |
|---|---|---|---|---|
| 8,570,805 B2 * | 10/2013 | Lee et al. | ................. | 365/185.17 |
| 2011/0051520 A1 * | 3/2011 | Kim | ........................ | 365/185.19 |
| 2011/0267892 A1 * | 11/2011 | Kim | ........................ | 365/185.21 |
| 2012/0314506 A1 * | 12/2012 | Baek et al. | ............... | 365/185.25 |
| 2013/0141970 A1 * | 6/2013 | Shibata | .................... | 365/185.02 |
| 2014/0056069 A1 * | 2/2014 | Park et al. | ................ | 365/185.05 |

FOREIGN PATENT DOCUMENTS

KR  1020110131984  12/2011

\* cited by examiner

*Primary Examiner* — Gene Auduong
(74) *Attorney, Agent, or Firm* — IP & T Group LLP

(57) ABSTRACT

A semiconductor device includes first memory blocks arranged in a longitudinal direction, and including a plurality of strings, wherein the strings are formed along a vertical direction, and the strings adjacent to each other share bit lines or source lines with each other, each string including a drain selection transistor coupled to an odd drain selection line or an even drain selection line, memory cells coupled to word lines, and a source selection transistor coupled to an odd source selection line or an even source selection line, page buffers suitable for storing data, a selection switch unit suitable for transferring the data stored in the page buffers or various voltages supplied from an external source to the bit lines and the source lines; and a control circuit suitable for controlling the page buffers and the selection switch unit.

20 Claims, 8 Drawing Sheets

SEMICONDUCTOR DEVICE AND METHOD OF OPERATING THE SAME

CROSS-REFERENCE TO RELATED APPLICATION

The present application claims priority to Korean patent application number 10-2013-0084685 filed on Jul. 18, 2013, in the Korean Intellectual Property Office, the entire disclosure of which is incorporated by reference herein.

BACKGROUND

1. Technical Field

Various exemplary embodiments relate to a semiconductor device and a method of operating the same, and more particularly, to a semiconductor device having a vertical channel and a method of operating the same.

2. Related Art

An increase in demand of cellular phones, portable memory devices and digital cameras are leading to an increase in demand of non-volatile memory devices that are used mainly as memory devices of these products. Among the non-volatile memory devices, NAND flash memory devices are widely used as data storage devices.

NAND flash memory devices may be classified into two-dimensional (2D) semiconductor devices in which strings are formed in a horizontal direction to a semiconductor substrate and three-dimensional (3D) semiconductor devices in which strings are formed in a vertical direction to a semiconductor substrate.

A 3D semiconductor device is designed to overcome physical limits in improving the degree of integration of a 2D semiconductor device. The 3D semiconductor device may include a plurality of strings that are formed in a vertical direction to a semiconductor substrate. Each of the strings may include a drain selection transistor, a plurality of memory cells and a source selection transistor that are coupled in series between a bit line and a source line.

In the 3D semiconductor device having the above configuration, threshold voltages of the memory cells, coupled adjacent to the drain selection transistor, may be changed by resistance around the source line during program and read operations, which may deteriorate the reliability of the 3D semiconductor device.

SUMMARY

Various exemplary embodiments relate to a semiconductor memory capable of improving the reliability of program, read and erase operations and a method of operating the same.

A semiconductor device according to an exemplary embodiment of the present invention may include first memory blocks arranged in a longitudinal direction, and including a plurality of strings, wherein the strings are formed along a vertical direction, and the strings adjacent to each other share bit lines or source lines with each other, each string including a drain selection transistor coupled to an odd drain selection line or an even drain selection line, memory cells coupled to word lines, and a source selection transistor coupled to an odd source selection line or an even source selection line, page buffers suitable for storing data, a selection switch unit suitable for transferring the data stored in the page buffers or various voltages supplied from an external source to the bit lines and the source lines, and a control circuit suitable for controlling the page buffers and the selection switch unit.

A semiconductor device according to an exemplary embodiment of the present invention may include memory blocks including a plurality of strings, wherein the strings are formed along a vertical direction and the strings adjacent to each other share bit lines or source lines, each string including a drain selection transistor coupled to an odd drain selection line or an even drain selection line, memory cells coupled to word lines, and a source selection transistor coupled to a source selection line, page buffers suitable for storing data, a selection switch unit suitable for transferring the data stored in the page buffers or various voltages supplied from an external source to the bit lines and the source lines, and a control circuit suitable for controlling the page buffers and the selection switch unit.

A method of operating a semiconductor device including a program method of a memory block including a plurality of strings, each having first memory cells and second memory cells coupled between source lines and bit lines, formed along a vertical direction, coupled to an odd drain selection line or an even drain selection line, and coupled to an odd source selection line or an even source selection line, the program method according to an exemplary embodiment of the present invention may include performing a first program operation sequentially on the first memory cells in a direction from the source lines to the bit lines, and performing a second program operation sequentially on the second memory cells in a direction from the bit lines to the source lines.

A method of operating a semiconductor device including a read method of a memory block including a plurality of strings, each having first memory cells and second memory cells coupled between source lines and bit lines, arranged in a vertical direction, coupled to an odd drain selection line or an even drain selection line, and coupled to an odd source selection line or an even source selection line, the read method according to an exemplary embodiment of the present invention may include performing a first read operation sequentially on the first memory cells in a direction from the source lines to the bit lines, and performing a second read operation sequentially on the second memory cells in a direction from the bit lines to the source lines.

A method of operating a semiconductor device including an erase method of a memory block including a plurality of strings, each having first memory cells and second memory cells coupled between source lines and bit lines, arranged in a vertical direction, coupled to an odd drain selection line or an even drain selection line, and coupled to an odd source selection line or an even source selection line, the erase method according to an exemplary embodiment of the present invention may include performing an erase operation to erase memory cells, which are included in a selected memory block, by applying an erase voltage to the bit lines and the source lines coupled to the selected memory block, and applying an erase permission voltage to word lines coupled to the selected memory block, performing an erase verification operation on the memory cells, and repeating the erase operation and the erase verification operation until the memory cells pass the erase verification operation while an erase inhibition voltage is applied to bit lines and source lines coupled to strings that are completely erased, among the bit lines and the source lines, based on a result of the erase verification operation.

DETAILED DESCRIPTION

Figure 1:
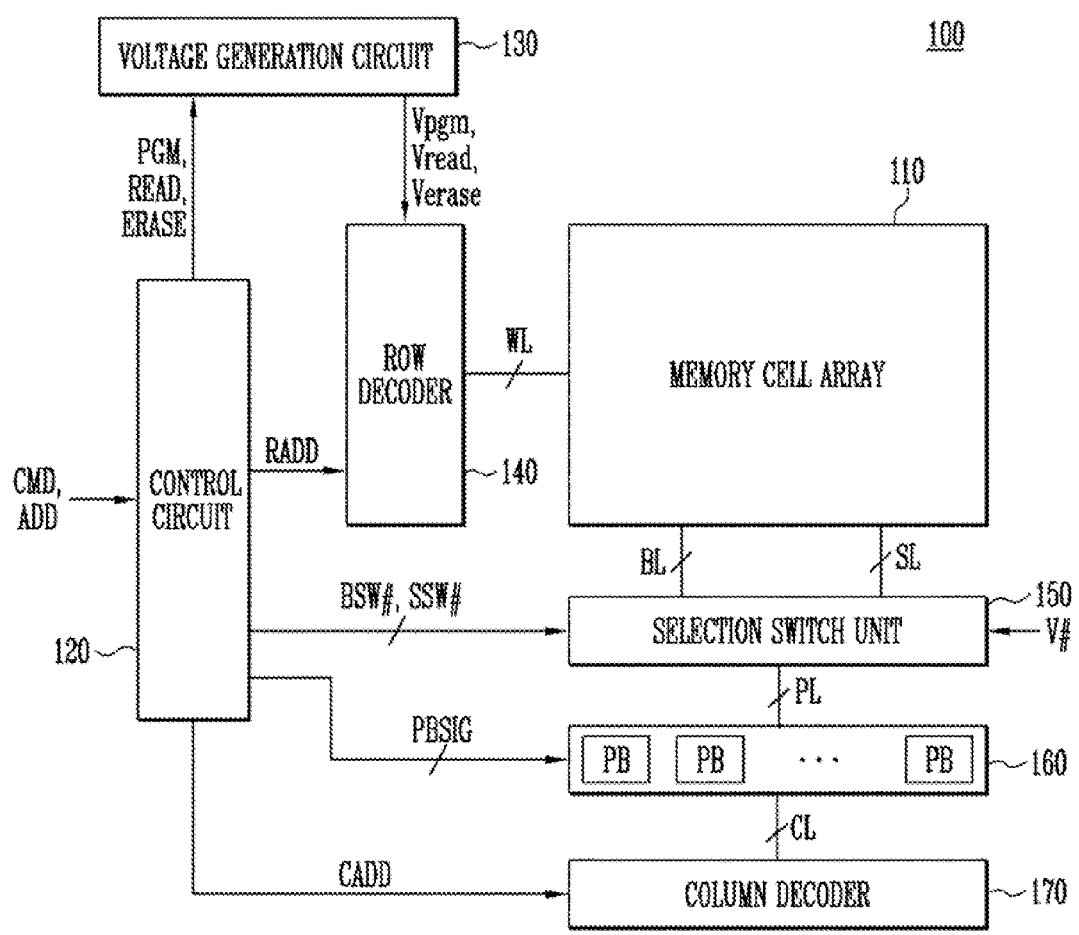
FIG. 1 is a block diagram illustrating a semiconductor device according to an exemplary embodiment of the present invention.

Hereinafter, various embodiments will be described in detail with reference to the accompanying drawings. The figures are provided to allow those having ordinary skill in the art to understand the scope of the embodiments of the disclosure. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, reference numerals correspond directly to the like parts in the various figures and embodiments of the present invention.

Furthermore, 'connected/coupled' represents that one component is directly coupled to another component or indirectly coupled through another component. In this specification, a singular form may include a plural form as long as it is not specifically mentioned in a sentence. Furthermore, 'include/comprise' or 'including/comprising' used in the specification represents that one or more components, steps, operations, and elements exists or are added.

FIG. 1 is a schematic block diagram of a semiconductor device according to an exemplary embodiment of the present invention.

Referring to FIG. 1, the semiconductor device 100 may include a memory cell array 110 having a three-dimensional (3D) configuration, peripheral circuits 130 to 170 that may program, read and erase memory cells included in the memory cell array 110, and a control circuit 120 that may control the peripheral circuits 130 to 170.

The memory cell array 110 may include a plurality of memory blocks. Each of the memory blocks may include a plurality of strings having vertical channels. The strings are formed along a vertical direction to a semiconductor substrate (not shown), and the strings adjacent to each other share bit lines or source lines with each other. Each of the strings may include a plurality of memory cells that are coupled in series with each other along the respective vertical channel.

The peripheral circuits 130 to 170 may include a voltage generation circuit 130, a row decoder 140, a selection switch unit 150, a page buffer unit 160 and a column decoder 170.

The voltage generation circuit 130 may generate operating voltages for respective operations, for example, a program voltage Vpgm, a read voltage Vread or an erase voltage Verase based on a program signal PGM, a read signal READ or an erase signal ERASE, respectively. Though not illustrated in FIG. 1, the voltage generation circuit 130 may generate voltages having various voltage levels in addition to the program voltage Vpgm, the read voltage Vread and the erase voltage Verase.

The row decoder 140 may select one of the memory blocks based on a row address RADD, and transfer the operating voltages, generated by the voltage generation circuit 130, to word lines WL and selection lines (not illustrated) of the selected memory block.

The selection switch unit 150 may receive various voltages V# from external voltage sources and transfer the voltages V# to bit lines BL or source lines SL based on bit line selection signals BSW# and source line selection signals SSW#, or may transfer voltages inputted from page lines PL of the page buffer unit 160 to the bit lines BL or the source lines SL.

The page buffer unit 160 may include a plurality of page buffers PB. The page buffers PB may store data for a program operation based on a page buffer control signal PBSIG, or perform a verification operation during program, read and erase operations. The page buffers PB may transfer voltages to the page lines PL based on the stored data, or sense voltages applied to the page lines PL.

The column decoder 170 may transfer data to the page buffers PB or receive data from the page buffers PB based on a column address CADD.

The control circuit 120 may output the program signal PGM, the read signal READ, the erase signal ERASE, the row address RADD, the column address CADD, and a page buffer control signal PBSIG based on a command signal CMD and an address ADD.

Figure 2:
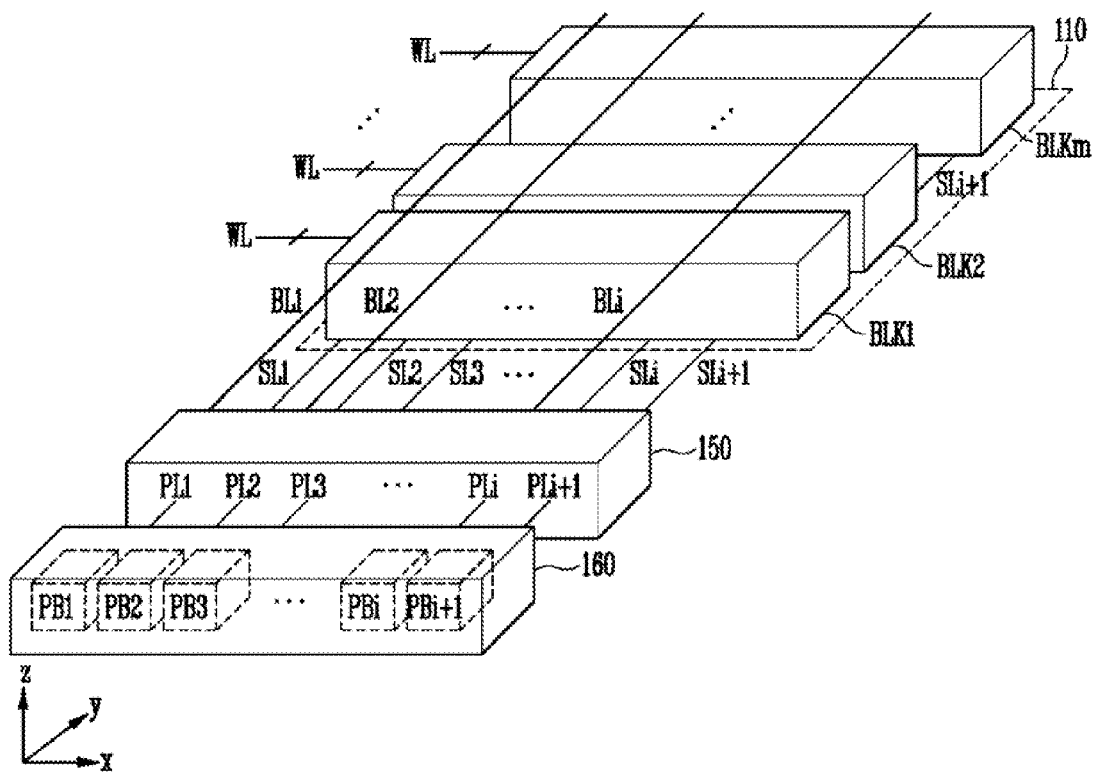
FIG. 2 is a detailed configuration illustrating a memory cell array, a selection switch unit, and a page buffer unit according to an embodiment of the present invention.

FIG. 2 is a detailed configuration illustrating the memory cell array, a selection switch unit, and a page buffer unit according to an embodiment of the present invention. In FIG. 2, elements, which are identical to constituent elements shown in FIG. 1, are assigned the same reference numerals, and repeated explanations thereof will be omitted or simplified.

Referring to FIG. 2, the memory cell array 110 may include a plurality of memory blocks BLK1 to BLKm that are arranged in a single layer in a longitudinal direction (Y direction) of a semiconductor substrate. For the purpose of explanation, the memory blocks BLK1 to BLKm may be referred to as first to m-th memory blocks BLK1 to BLKm, respectively. The first to m-th memory blocks BLK1 to BLKm may be arranged next to each other and share first to i-th bit lines BL1 to BLi and first to i+1-th source lines SL1 to SLi+1 with each other. The first to i-th bit lines BL1 to BLi and the first to i+1-th source lines SL1 to SLi+1 may be coupled to the selection switch unit 150. The selection switch unit 150 may be coupled to the page buffer unit 160 through first to i+1-th page lines PL1 to PLi+1. The page buffer unit 160 may include first to i+1-th page buffers PB1 to PBi+1. The first to i+1-th page buffers PB1 to PBi+1 may be coupled to the first to i+1-th page lines PL1 to PLi+1, respectively.

Figure 3:
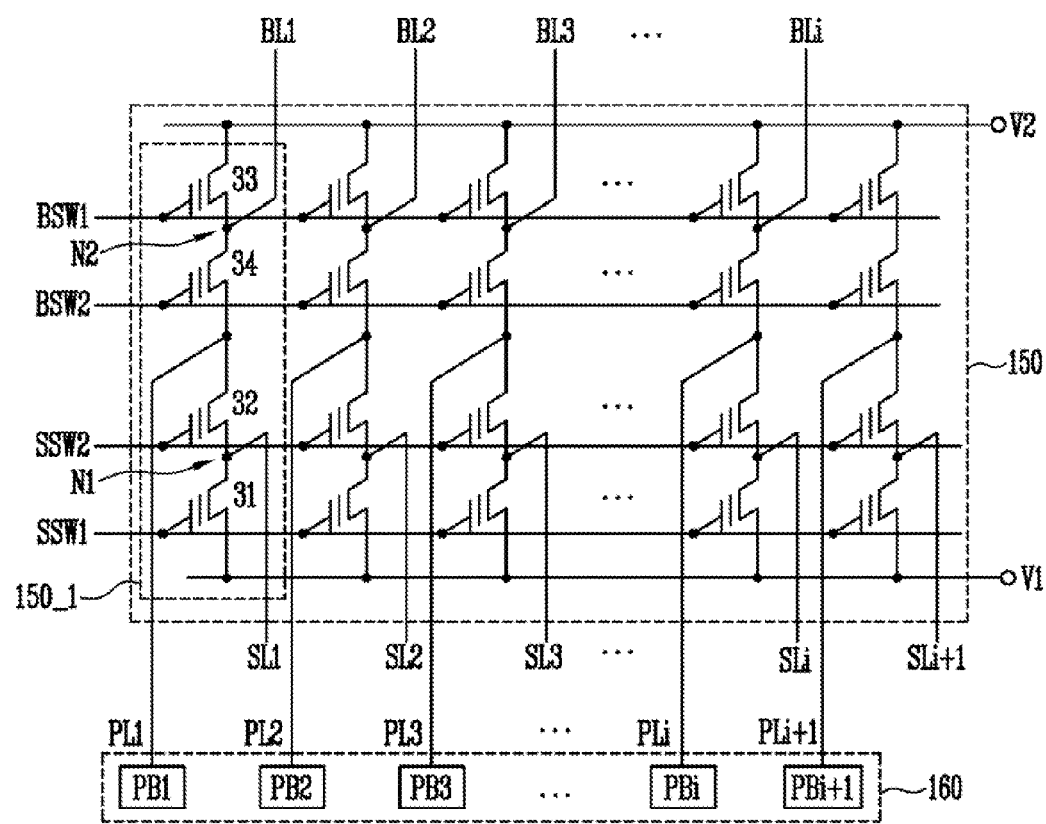
FIG. 3 is a circuit diagram illustrating the selection switch unit of FIG. 2.

FIG. 3 is a circuit diagram illustrating the selection switch unit 150 of FIG. 2.

Referring to FIG. 3, the selection switch unit 150 may include a plurality of selection switch sections corresponding to the first to i+1-th page buffers PB1 to PBi+1, respectively. Since the selection switch sections may have substantially the same configuration as each other, one of the selection switch sections, i.e., a first selection switch section 150_1 corresponding to the first page buffer PB1 is described below as an example.

The first selection switch section 150_1 may include first to fourth switches 31 to 34 that are coupled in series between a first voltage (V1) terminal and a second voltage (V2) terminal. The first switch 31 may be coupled between the first voltage (V1) terminal and a first node N1. The second switch 32 may be coupled between the first node N1 and the first page line PL1. The first page line PL1 may be coupled to the first page buffer PB1. The third switch 33 may be coupled between the second voltage (V2) terminal and a second node N2. The fourth first switch 34 may be coupled between the second node N2 and the first page line PL1. The first source line SL1 may be coupled to the first node N1, and the first bit line BL1 may be coupled to the second node N2. In this manner, the remaining selection switch sections may be coupled to the second to i+1-th page buffers PB2 to PBi+1. However, a bit line may not be coupled to the selection switch section to which the i+1-th page buffer PBi+1 is coupled since the number of the bit lines BL1 to BLi is smaller than the number of the source lines SL1 to SLi+1 or the number of the page buffers PB1 to PBi+1.

The first and second switches 31 and 32 may operate based on first and second source line selection signals SSW1 and SSW2, respectively. The third and fourth switches 33 and 34 may operate based on third and fourth source line selection signals SSW3 and SSW4, respectively. A first voltage V1 supplied to the first voltage (V1) terminal and a second voltage V2 supplied to the second voltage (V2) terminal may be supplied from different voltage sources. These voltage sources may supply voltages having various voltage levels, such as a ground voltage, a power voltage and an erase voltage.

Figure 4:
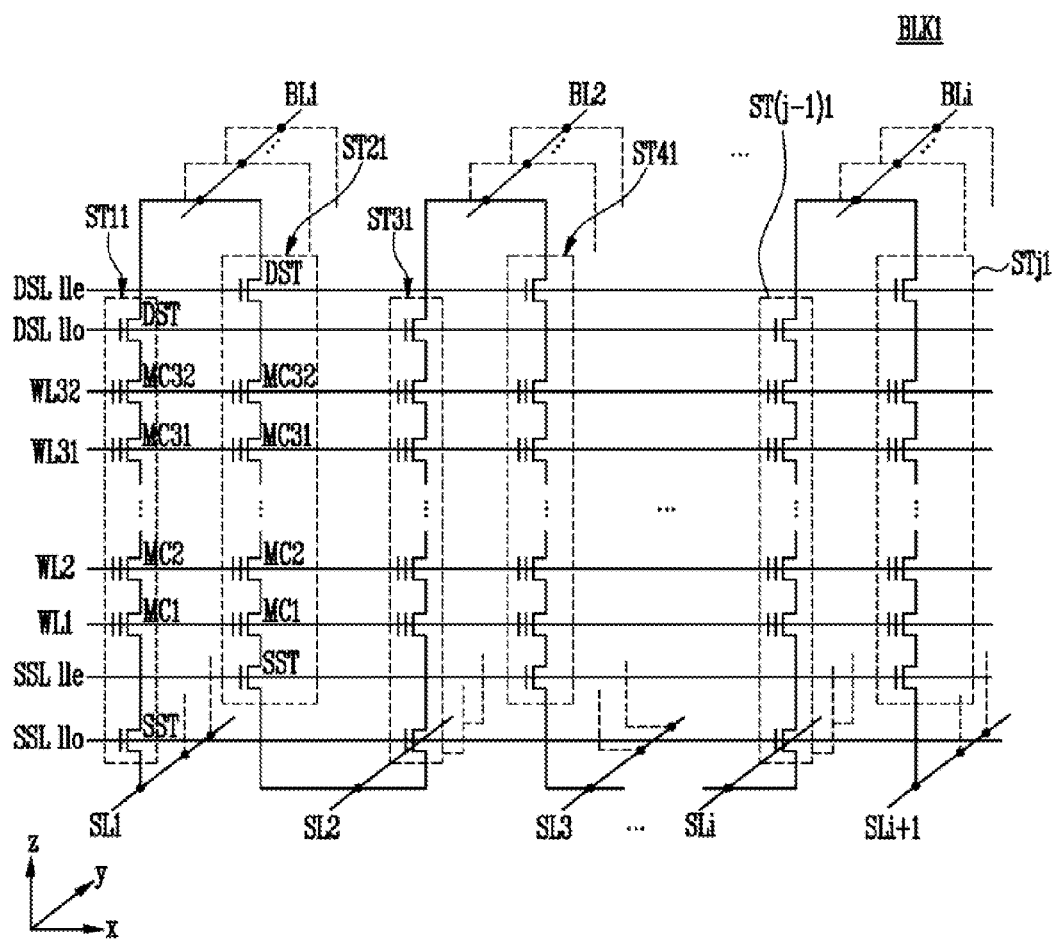
FIG. 4 is a circuit diagram illustrating one of memory blocks of FIG. 2 in a transverse direction.

FIG. 4 is a circuit diagram illustrating one of the memory blocks of FIG. 2 in a transverse direction of the semiconductor substrate, i.e., a major axis of the memory blocks.

Referring to FIG. 4, since the first to m-th memory blocks BLK1 to BLKm, which are included in the memory cell array 110, may have substantially the same configuration as each other, the first memory block BLK1 will be described as an example for the convenience of explanation.

The first memory block BLK1 may include a plurality of strings that are formed along a vertical direction to the substrate and are arranged in a transverse direction of the semiconductor substrate (X direction) and a longitudinal direction of the semiconductor substrate (Y direction). Each of the strings may include a drain selection transistor DST, memory cells MC1 to MC32 and a source selection transistor SST that are coupled in series. Gates of the drain selection transistors DST may be coupled to a first odd drain selection line DSL11o or a first even drain selection line DSL11e. Gates of the memory cells MC1 to MC32 may be coupled to word lines WL1 to WL32, respectively. Gates of the source selection transistors SST may be coupled to a first odd source selection line SSL11o or a second even source selection line SSL11e. For example, the gates of the drain selection transistors DST, which are included in the strings adjacent to each other in the transverse direction (X direction), may be coupled to different drain selection lines DSL11o or DSL11e, and the gates of the source selection transistors SST, which are included in the strings adjacent to each other in the transverse direction (X direction), may be coupled to different source selection lines SSL11o or SSL11e.

The relationship between the strings, arranged in the transverse direction, will be described below in detail.

When the first to fourth strings, arranged in the transverse direction (X direction), are referred to as first to fourth strings ST11 to ST41, respectively, the first source line SL1 may be coupled to the first string ST11. The first bit line BL1 may be coupled in common to the first and second strings ST11 and ST21. The second source line SL2 may be coupled in common to the second and third strings ST21 and ST31. The second bit line BL2 may be coupled in common to the third and fourth strings ST31 and ST41. The i-th bit line BLi may be coupled to the last string STj1, j being i*2, among the strings arranged in the transverse direction (X direction), and a string ST(j−1)1 prior to the last string STj1. The i+1-th source line SLi+1 may be coupled to the last string STJ1.

When the gate of the drain selection transistor DST, which is included in the first string ST11, is coupled to the first odd drain selection line DSL11o, the gate of the drain selection transistor DST, which is included in the second string ST21, may be coupled to the first even drain selection line DSL11e. In other words, the gates of the drain selection transistors DST, which are included in odd-numbered strings ST11, ST31, ST51, . . . , arranged in the transverse direction (X direction), may be coupled in common to the first odd drain selection line DSL11o. The gates of the drain selection transistors DST, which are included in even-numbered strings ST21, ST41, ST61, . . . , may be coupled in common to the first even drain selection line DSL11e. In addition, the gates of the source selection transistors SST, which are included in the odd-numbered strings ST11, ST31, ST51, . . . , arranged in the transverse direction (X direction), may be coupled in common to the first odd source selection line SSL11o. The gates of the source selection transistors SST, which are included in the even-numbered strings ST21, ST41, ST61, . . . , may be coupled in common to the first even source selection line SSL11e.

Figure 5:
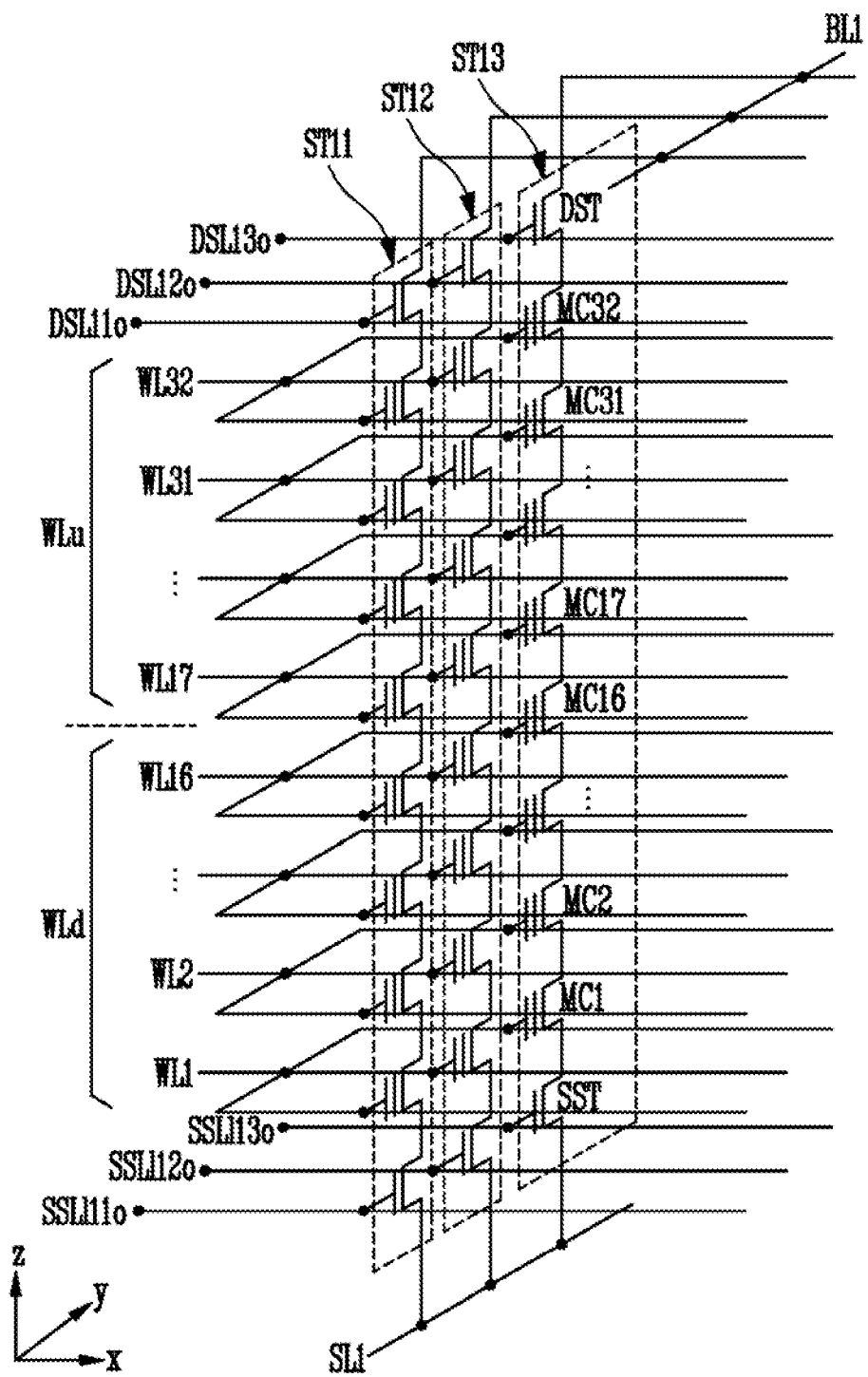
FIG. 5 is a circuit diagram illustrating one of memory blocks of FIG. 2 in a longitudinal direction.

FIG. 5 is a circuit diagram illustrating one of the memory blocks of FIG. 2 in a longitudinal direction, i.e., a minor axis of the memory blocks.

Referring to FIG. 5, strings arranged in the longitudinal direction (Y direction) may have substantially the same configuration as each other. For example, when the first to third strings that are arranged in the longitudinal direction (Y direction) are referred to as the first to third strings ST11 to ST13, respectively, each of the first to third strings ST11 to ST13 may Include the drain selection transistor DST, the memory cells MC1 to MC32 and the source selection transistor SST that are coupled in series with each other. For example, gates of the drain selection transistors DST, which are included in the first to third strings ST11 to ST13, may be coupled to different odd drain selection lines DSL11o, DSL12o and DSL13o, respectively. The memory cells MC1 to MC32, which are included in the same pages, may be coupled in common to the word line WL1 to WL32 corresponding to the respective pages. More specifically, the first memory cells MC1, which are included in the first page of the first to third strings ST11 to ST13, may be coupled in common to the first word line WL1. The second memory cells MC2, which are included in the second page, may be coupled in common to the second word line WL2. In this manner, the memory cells MC3 to MC32, which are included in the remaining pages, may be coupled in common to the word lines WL3 to WL32, respectively. Gates of the source selection transistors SST, which are included in the first to third strings ST11 to ST13, may be coupled to different odd source selection lines SSL11o, SSL12o and SSL13o, respectively. Drains of the drain selection transistors DST, which are included in the first to third strings ST11 to ST13, may be coupled in common to the first bit line BL1. Sources of the source selection transistors SST may be coupled in common to the first source line SL1.

A program operation of a semiconductor device that includes strings, each of which includes 32 memory cells, will be described with reference to Table 1 below.

TABLE 1

| | 1 | 2 | ... | 15 | 16 | 17 | 18 | ... | 31 | 32 |
|---|---|---|---|---|---|---|---|---|---|---|
| BL | Vcc/0 V | Vcc/0 V | Vcc/0 V | Vcc/0 V | Vcc/0 V | Vcc | Vcc | Vcc | Vcc | Vcc |
| DSL11e | Vds12 | Vds12 | Vds12 | Vds12 | Vds12 | 0 V | 0 V | 0 V | 0 V | 0 V |
| DSL11o | Vds11 | Vds11 | Vds11 | Vds11 | Vds11 | 0 V | 0 V | 0 V | 0 V | 0 V |
| WL32 | Vpassp | Vpassp | Vpassp | Vpassp | Vpassp | Vpgm | Vpassp | Vpassp | Vpassp | Vpassp |
| WL31 | Vpassp | Vpassp | Vpassp | Vpassp | Vpassp | Vpassp | Vpgm | Vpassp | Vpassp | Vpassp |
| ... | Vpassp | Vpassp | Vpassp | Vpassp | Vpassp | Vpassp | Vpassp | ... | Vpassp | Vpassp |
| WL18 | Vpassp | Vpassp | Vpassp | Vpassp | Vpassp | Vpassp | Vpassp | Vpassp | Vpgm | Vpassp |
| WL17 | Vpassp | Vpassp | Vpassp | Vpassp | Vpassp | Vpassp | Vpassp | Vpassp | Vpassp | Vpgm |
| WL16 | Vpassp | Vpassp | Vpassp | Vpassp | Vpgm | Vpassp | Vpassp | Vpassp | Vpassp | Vpassp |
| WL15 | Vpassp | Vpassp | Vpassp | Vpgm | Vpassp | Vpassp | Vpassp | Vpassp | Vpassp | Vpassp |
| ... | Vpassp | Vpassp | ... | Vpassp | Vpassp | Vpassp | Vpassp | Vpassp | Vpassp | Vpassp |
| WL2 | Vpassp | Vpgm | Vpassp | Vpassp | Vpassp | Vpassp | Vpassp | Vpassp | Vpassp | Vpassp |
| WL1 | Vpgm | Vpassp | Vpassp | Vpassp | Vpassp | Vpassp | Vpassp | Vpassp | Vpassp | Vpassp |
| SSL11e | 0 V | 0 V | 0 V | 0 V | 0 V | Vss12 | Vss12 | Vss12 | Vss12 | Vss12 |
| SSL11o | 0 V | 0 V | 0 V | 0 V | 0 V | Vss11 | Vss11 | Vss11 | Vss11 | Vss11 |
| SL | Vcc | Vcc | Vcc | Vcc | Vcc | Vcc/0 V | Vcc/0 V | Vcc/0 V | Vcc/0 V | Vcc/0 V |

The program operation may be performed by dividing memory cells, which are included in strings, into two groups. A first program operation may be sequentially performed on a first group WLd from memory cells adjacent to the source lines SL to memory cells located near the center. Subsequently, a second program operation may be sequentially performed on a second group WLu from memory cells adjacent to the bit lines BL to memory cells located near the center, except for the first group. For the convenience of explanation, in Table 1, the source lines SL1 to SLi+1 may be represented by SL, and the bit lines BL1 to BLi may be represented by BL.

The first to 16th memory cells may be grouped into the first group WLd, and the 17th to 32nd memory cells may be grouped into a second group WLu. The first to 16th memory cells, which are included in the first group WLd, may be first programmed, and the 17th to 32nd memory cells, which are included in the second group WLu, may be subsequently programmed. The first program operation may be performed on the memory cells, which are included in the first group WLd, in a forward direction, i.e., in an upward direction, while the second program operation may be performed on the memory cells, which are included in the second group WLu, in a reverse direction, i.e., in a downward direction.

More specifically, the memory cells, which are included in the first group WLd, may be sequentially programmed in a direction from the source lines SL towards the center. The memory cells, which are included in the second group WLu, may be programmed in a direction from the bit lines BL to the center. In other words, the memory cells, which are coupled to the first word line WL1, may be the memory cells adjacent to the source lines SL, and the memory cells, which are coupled to the 32nd word line WL32, may be the memory cells adjacent to the bit lines BL.

Different voltages may be applied to the source lines SL and the bit lines BL during the first program operation of the first group WLd and the second program operation of the second group WLu, which is described below in detail.

First Program Operation of First Group WLd

The first program operation of selected memory cells, which are included in the first group WLd, may be sequentially performed from the first memory cells MC1 adjacent to the first odd source selection line SSL11o to the center of the string.

During the first program operation of the first group WLd, a power voltage Vcc may be applied to the source lines SL in order to prevent a leakage of a channel voltage, and a program permission voltage or a program prohibition voltage may be applied to the bit lines BL. For the above-described operation, the first voltage V1 of FIG. 3 may be set to the power voltage Vcc. Thus, the power voltage Vcc may be applied to the source lines SL by turning on the first switches 31 of the selection switch unit 150 and turning off the second switches 32.

Data of '0' or '1' may be input to the page buffers PB1 to PBi+1. In general, '0' may refer to data to be programmed, and '1' may refer to data not to be programmed. Page buffers to which data of '0' is input may output the program permission voltage, i.e., a voltage of 0V to page lines PL1 to PLi+1. The page buffers to which the data of '1' is input may apply the program prohibition voltage, i.e., the power voltage Vcc, to the page lines PL1 to PLi+1. When the program permission voltage of 0V is applied to the page lines PL1 to PLi+1, the page lines PL1 to PLi+1 may be coupled to a ground terminal through the page buffer PB. Therefore, the program permission voltage of 0V or the program prohibition voltage Vcc may be applied to the page lines PL1 to PLi+1 based on the data input to the page buffers PB1 to PBi+1. In order to apply the program permission voltage or the program prohibition voltage to the bit lines BL, the third switches 33, which are included in the selection switch unit 150, may be turned off, and the fourth switches 34 may be turned on.

A program pass voltage Vpassp may be applied to the first to 32nd word lines WL1 to WL32, a source turn-off voltage of 0V may be applied to the first odd and even source selection lines SSL11o and SSL11e, and first and second drain turn-on voltages Vdsl1 and Vdsl2 may be applied to the first odd and even drain selection lines DSL11o and DSL11e, respectively.

More specifically, the first drain turn-on voltage Vdsl1 may be applied to the first odd drain selection line DSL11o, and the second drain turn-on voltage Vdsl2 may be applied to the first even drain selection line DSL11e. For example, after a channel is formed in strings, in order to generate channel boosting in unselected strings, each of the first drain turn-on voltage Vdsl1 and the second drain turn-on voltage Vdsl2 may be reduced to a low voltage level from a high voltage level.

For example, when the odd-numbered strings ST11, ST31, ... are to be programmed, and the even-numbered strings ST21, ST41, ... are not to be programmed, a channel may be formed in the strings by setting each of the first drain turn-on voltage Vdsl1 and the second drain turn-on voltage Vdsl2 to a voltage level of approximately 4V. Subsequently, the voltage level of the first drain turn-on voltage Vdsl1 may be reduced to approximately 1.5V, so that the program permission voltage or the program prohibition voltage may be applied to the selected strings. In addition, the voltage level of the second drain turn-on voltage Vdsl2 may be reduced to 0V or a negative voltage (e.g., ~2V), and channel boosting may occur in the unselected strings by the program pass voltage Vpassp and the program prohibition voltage.

Subsequently, selected memory cells, among the first memory cells MC1 included in the odd-numbered strings ST11, ST31, . . . , may be programmed by applying the program voltage Vpgm to the selected first word line WL1.

By using the above-described method, the remaining memory cells, which are included in the first group WLd, may be sequentially programmed from the second memory cells MC2 towards the 16th memory cells MC16.

Second Program Operation of Second Group WLu

When the first program operation on the selected memory cells, which are included in the first group WLd, is completed, the second program operation may be performed on selected memory cells included in the second group WLu.

The second program operation may be sequentially performed on the selected memory cells, which are included in the second group WLu, in a direction from the 32nd memory cells MC32 adjacent to the first odd drain selection line DSL11o to the center of the string.

Contrary to the first program, the power voltage Vcc may be applied to the bit lines BL in order to prevent a leakage of a channel voltage, and the program permission voltage or the program prohibition voltage may be applied to the source lines SL during the second program operation of the second group WLu. For the above-described operation, the second voltage V2 of FIG. 3 may be set to the power voltage Vcc. Thus, the power voltage Vcc may be applied to the bit lines BL by turning on the third switches 33, which are included in the selection switch unit 150, and turning off the fourth switches 34.

During the second program operation, data of '0' or '1' may be input to the page buffers PB1 to PBi+1. In general, '0' may refer to data to be programmed, and '1' may refer to data not to be programmed. Page buffers, to which the data of '0' is input, among the page buffers PB1 to PBi+1, may output the program permission voltage, i.e., a voltage of 0V through page lines PL1 to PLi+1 coupled to the corresponding page buffers. Page buffers, to which the data of '1' is input, among the page buffers PB1 to PBi+1, may output the program prohibition voltage, i.e., the power voltage Vcc through page lines PL1 to PLi+1 coupled to the corresponding page buffers. When the program permission voltage of 0V is applied to the page lines PL1 to PLi+1, the page lines PL1 to PLi+1 may be coupled to a ground terminal through the page buffers PB1 to PBi+1. Accordingly, the program permission voltage of 0V or the program prohibition voltage Vcc may be applied to the page lines PL1 to PLi+1 based on the data input to the page buffers.

In order to apply the second voltage V2 having a voltage level of the power voltage Vcc to the bit lines BL, the third switches 33, which are included in the selection switch unit 150, may be turned on, and the fourth switches 34 may be turned off. In order to apply the program permission voltage or the program prohibition voltage to the source lines SL, the first switches 31, which are included in the selection switch unit 150, may be turned off, and the second switches 32 may be turned on.

The program pass voltage Vpassp may be applied to the first to 32nd word lines WL1 to WL32, a drain turn-off voltage of 0V may be applied to the first odd drain selection line DSL11o and the first even drain selection line DSL11e, and first and second source turn-on voltages Vssl1 and Vssl2 may be applied to the first odd and even source selection lines SSL11o and SSL11e, respectively. More specifically, the first source turn-on voltage Vssl1 may be applied to the first odd source selection line SSL11o, and the second source turn-on voltage Vssl2 may be applied to the first even source selection line SSL11e.

After a channel is formed in strings, in order to generate channel boosting in unselected strings, each of the first source turn-on voltage Vssl1 and the second source turn-on voltage Vssl2 may be reduced to a low voltage level from a high voltage level. For example, when the odd-numbered strings ST11, ST31, . . . correspond to selected strings to be programmed, and the even-numbered strings ST21, ST41, . . . are unselected strings not to be programmed, a channel may be formed in the strings by setting each of the first source turn-on voltage Vssl1 and the second source turn-on voltage Vssl2 to a voltage level of approximately 4V. Subsequently, the program permission voltage or the program prohibition voltage may be applied to the selected strings by reducing the first source turn-on voltage Vssl1 to a voltage level of approximately 1.5V. In addition, channel boosting may occur in the unselected strings by the program pass voltage Vpassp and the program prohibition voltage by reducing the second source turn-on voltage Vssl2 to 0V or a negative voltage (e.g., −2V).

Subsequently, by applying the program voltage Vpgm to the selected 32nd word line WL32, selected memory cells among the 32nd memory cells MC32 included in the odd-numbered strings (ST11, ST31, . . . ) may be programmed.

By using the above-described method, the remaining memory cells, which are included in the second group WLu, may be sequentially programmed from the 31st memory cells MC31 to the 17th memory cells MC17.

As described above, during the second program operation of the memory cells, which are included in the second group WLu distant from the source lines SL1 to SLi+1, the second program operation may be sequentially performed in order of proximity to the bit lines BL1 to BLi.

Since the bit lines BL1 to BLi+1 may function as the source lines SL1 to SLi+1, respectively, or vice versa, the resistance of the strings caused by distances between the source lines SL1 to SLi+1 and the selected memory cells may be reduced during the program operation. Since program disturbance may be suppressed, and retention characteristics may be improved by reducing resistance of strings during a program operation, the reliability of the program operation may be improved.

A read operation of a semiconductor device is described with reference to Table 2 below.

TABLE 2

| | 1 | 2 | ... | 15 | 16 | 17 | 18 | ... | 31 | 32 |
|---|---|---|---|---|---|---|---|---|---|---|
| BL | VCC | VCC | VCC | VCC | VCC | 0 V | 0 V | 0 V | 0 V | 0 V |
| DSL11e | 0 V | 0 V | 0 V | 0 V | 0 V | 0 V | 0 V | 0 V | 0 V | 0 V |
| DSL11o | Vds11 | Vds11 | Vds11 | Vds11 | Vds11 | Vds11 | Vds11 | Vds11 | Vds11 | Vds11 |
| WL32 | Vpassr | Vpassr | Vpassr | Vpassr | Vpassr | Vread | Vpassr | Vpassr | Vpassr | Vpassr |
| WL31 | Vpassr | Vpassr | Vpassr | Vpassr | Vpassr | Vpassr | Vread | Vpassr | Vpassr | Vpassr |

TABLE 2-continued

|      | 1     | 2     | ... | 15    | 16    | 17    | 18    | ...   | 31    | 32    |
|------|-------|-------|-----|-------|-------|-------|-------|-------|-------|-------|
| ...  |       | Vpassr | Vpassr | Vpassr | Vpassr | Vpassr | Vpassr | ... | Vpassr | Vpassr |
| WL18 | Vpassr | Vpassr | Vpassr | Vpassr | Vpassr | Vpassr | Vpassr | Vpassr | Vread | Vpassr |
| WL17 | Vpassr | Vpassr | Vpassr | Vpassr | Vpassr | Vpassr | Vpassr | Vpassr | Vpassr | Vread |
| WL16 | Vpassr | Vpassr | Vpassr | Vpassr | Vread | Vpassr | Vpassr | Vpassr | Vpassr | Vpassr |
| WL15 | Vpassr | Vpassr | Vpassr | Vread | Vpassr | Vpassr | Vpassr | Vpassr | Vpassr | Vpassr |
| ...  | Vpassr | Vpassr | ...  | Vpassr | Vpassr | Vpassr | Vpassr | Vpassr | Vpassr | Vpassr |
| WL2  | Vpassr | Vread | Vpassr | Vpassr | Vpassr | Vpassr | Vpassr | Vpassr | Vpassr | Vpassr |
| WL1  | Vread | Vpassr | Vpassr | Vpassr | Vpassr | Vpassr | Vpassr | Vpassr | Vpassr | Vpassr |
| SSL11e | 0 V | 0 V | 0 V | 0 V | 0 V | 0 V | 0 V | 0 V | 0 V | 0 V |
| SSL11o | Vss11 | Vss11 | Vss11 | Vss11 | Vss11 | Vss11 | Vss11 | Vss11 | Vss11 | Vss11 |
| SL   | 0 V | 0 V | 0 V | 0 V | 0 V | VCC | VCC | VCC | VCC | VCC |

Referring to Table 2, the read operation may be performed in a substantially similar manner to the above-described program operation. The read operation may be performed by dividing memory cells, which are included in strings, into two groups. When a single string includes 32 memory cells, the first to 16th memory cells may be grouped into the first group WLd, and the 17th to 32nd memory cells may be grouped into the second group WLu. A first read operation may be performed on the memory cells, which are included in the first group WLd, in a forward direction, i.e., in an upward direction, while a second read operation may be formed on the memory cells, which are included in the second group WLu, in a reverse direction, i.e., in a downward direction. More specifically, the memory cells, which are included in the first group WLd, may be read in a direction from the source lines SL to the center. The memory cells, which are included in the second group WLu, may be read in a direction from the bit lines BL to the center. For the convenience of explanation, in Table 2, the source lines SL1 to SLi+1 may be represented by SL, and the bit lines BL1 to BLi may be represented by as BL.

In order to perform the above-described read operations, different voltages may be applied to the source lines SL and the bit lines BL during the first read operation of the first group WLd and the second read operation of the second group WLu, which is described below in detail.

First Read Operation of First Group WLd

The first read operation may be sequentially performed on the memory cells, which are included in the first group WLd, from the first memory cells MC1 adjacent to the first odd source selection line SSL11o towards the center of the string.

During the first read operation of the first group WLd, 0V may be applied to the source lines SL, and a precharge voltage may be applied to the bit lines BL. For example, the precharge voltage may be a positive voltage, such as the power voltage VCC or around 1V. The first voltage V1 of FIG. 3 may be set to 0V and be applied to the source lines SL by turning on the first switches 31, which are included in the selection switch unit 150, and turning off the second switches 32. During the first read operation, the data of '0' may be input to the page buffers PB1 to PBi+1. When the data of '0' is input to the page buffers PB1 to PBi+1, the precharge voltage may be applied to the page lines PL1 to PLi+1. In order to apply the precharge voltage to the bit lines BL1 to BLi, the third switches 33, which are included in the selection switch unit 150, may be turned off, and the fourth switches 34 may be turned on.

The read voltage Vread may be applied to the first word line WL1, a read pass voltage Vpassr may be applied to the second to 32nd word lines WL2 to WL32, the first source turn-on voltage Vssl1 may be applied to the first odd source selection line SSL11o, the source turn-off voltage may be applied to the first even source selection line SSL11e, the first drain turn-on voltage Vdsl1 may be applied to the first odd drain selection line DSL11o, and the drain turn-off voltage may be applied to the first even drain selection lines DSL11e. Accordingly, the memory cells coupled to the odd-numbered strings ST11, ST31, . . . among the first memory cells MC1 coupled to the first word line WL1 may be read. Each of the first source turn-on voltage Vssl1 and the first drain turn-on voltage Vdsl1 may have a voltage level of approximately 4V.

By the above-described method, the remaining memory cells, which are included in the first group WLd, may be read from the second memory cells MC2 to the 16th memory cells MC16.

Second Read Operation of Second Group WLu

When the first read operation of the memory cells, which are included in the first group WLd, is completed, the second read operation may be performed on the memory cells of the second group WLu.

The second read operation may be sequentially performed in a direction from the 32nd memory cells MC32 adjacent to the first odd drain selection line DSL11o to the center of the string.

Contrary to the first read operation, 0V may be applied to the bit lines BL, and a precharge voltage may be applied to the source lines SL during the second read operation of the second group WLu. For the above-described operation, the second voltage V2 of FIG. 3 may be set to 0V. Thus, 0V may be applied to the bit lines BL1 to BLi by turning on the third switches 33, which are included in the selection switch unit 150, and turning off the fourth switches 34. During the second read operation, the data of '0' may be applied to the page buffers PB1 to PBi+1. When the data of '0' is input to the page buffers PB1 to PBi+1, the precharge voltage may be applied to the page lines PL1 to PLi+1. In order to apply the precharge voltage to the source lines SL, the first switches 31 of the selection switch unit 150 may be turned off, and the second switches 32 may be turned on.

The read voltage Vread may be applied to the 32nd word line WL32, the read pass voltage Vpassr may be applied to the 31st to first word lines WL31 to WL1, the first drain turn-on voltage Vdsl1 may be applied to the first odd drain selection line DSL11o, the drain turn-off voltage of 0V may be applied to the first even drain selection line DSL11e, the first source turn-on voltage Vssl1 may be applied to the first odd source selection line SSL11o, and the source turn-off voltage of 0V may be applied to the first even source selection line SSL11e. Accordingly, the 32nd memory cells MC32, coupled to the 32nd word line WL32, may be read. Each of the first drain turn-on voltage Vdsl1 and the first source turn-on voltage Vssl1 may have a voltage level of 4V.

By using the above-described method, the memory cells MC31 to MC17, which are included in the second group WLu, may be sequentially read by sequentially applying the read voltage from the 31st word line WL31 to the 17th word line WL17. The second read operation may be performed by sensing variations of voltages of the precharged bit lines BL or source lines SL. Since a sensing method is known in the art, a detailed description will be omitted.

As described above, since the bit lines BL may function as source lines or vice versa depending on positions of memory cells to be programmed, the resistance of the strings caused by distances between the memory cells and the source lines SL may be reduced during the read operation. Therefore, the reliability of the read operation may be improved.

An erase operation of the first memory block BLK1 of FIG. 2 will be described with reference to Table 3 below.

TABLE 3

|  | Sel. BLK | | Unsel. BLK |
|---|---|---|---|
|  | Sel. ST | In. ST | Unsel. ST |
| BL | Verase | Vinh | Verase/Vinh |
| DSL11e-DSL13e | Vdsl/0 V | Vdsl/0 V | — |
| DSL11o-DSL13o | Vdsl | Vdsl | — |
| DSL | — | — | Vdsl |
| WL32 | 0 V | 0 V | Vwl |
| ... | 0 V | 0 V | Vwl |
| WL1 | 0 V | 0 V | Vwl |
| SSL11e-SSL13e | Vssl/0 V | Vssl/0 V | — |
| SSL11o-SSL13o | Vssl | Vssl | — |
| SSL | — | — | Vssl |
| SL | Verase | Vinh | Verase/Vinh |

Referring to Table 3, when the erase operation starts, the erase voltage Verase may be applied to the bit lines BL and the source lines SL coupled to a selected memory block Sel. BLK.

A drain turn-on voltage Vdsl may be applied to first to third odd drain selection lines DSL11o to DSL13o and first to third even drain selection lines DSL11e to DSL13 coupled to a selected memory block Sel. BLK. A source turn-on voltage Vssl may be applied to first to third odd source selection lines SSL11o to SSL13o and first to third even source selection lines SSL11e to SSL13e. An erase permission voltage may be applied to the word lines WL1 to WL32. Thus, the memory cells MC1 to MC32, which are included in the selected memory block Sel. BLK, may be erased.

Alternatively, since the drain selection transistors DST and the source selection transistors SST, which are included in odd-numbered strings and even-numbered strings, may be separately operated, only the memory cells, which are included in the odd-numbered (or even-numbered) strings, may be selectively erased. For example, the erase voltage Verase being applied to the bit lines BL and the source lines SL may be prevented from being applied to a channel of the even-numbered strings by applying the drain turn-off voltage of 0V to the first to third even drain selection lines DSL11e to DSL13e and the first to third even source selection lines SSL11e to SSL13e coupled to the drain selection transistors DST of the even-numbered strings.

For example, the erase voltage Verase may be set to 18V, the drain and source turn-on voltages Vdsl and Vssl may be set to 15V, and the erase permission voltage may be set to 0V. However, these voltage levels are provided for understanding of the scope of the present invention. Voltage levels may vary depending on semiconductor devices.

Since the erase operation is performed using an increment step pulse erase (ISPE) method, an erase verification operation may be performed after the erase voltage Verase is applied to the channel through the bit lines BL1 to BLi and the source lines SL. The erase verification operation may be performed in unit of strings. More specifically, the erase verification operation may be performed in unit of strings coupled in common to the bit lines BL.

Strings having passed the erase verification operation may be defined as erase inhibition strings In. ST. Strings ST having not passed the erase verification operation may be defined as selected strings Sel. ST. Therefore, when the erase operation starts, all the strings included in the selected memory block Sel. BLK may be the selected strings Sel. ST. While the erase operation is being performed, some of the selected strings Sel. ST may be changed to the erase inhibition strings In. ST based on the erase verification operation. After the erase inhibition strings In. ST are formed, the erase operation may be performed while an erase inhibition voltage Vinh is being applied to the bit lines BL and the source lines SL coupled to the erase inhibition strings In. ST.

In other words, when the erase operation is performed on the selected strings Sel. ST, threshold voltages of memory cells included in the erase inhibition strings In. ST may be prevented from being further reduced by applying the erase inhibition voltage Vinh to the erase inhibition strings In. ST. The erase inhibition voltage Vinh may be less than the erase voltage Verase. More specifically, the erase inhibition voltage Vinh may correspond to approximately half of the erase voltage Verase. For example, when the erase voltage Verase is 18V, the erase inhibition voltage Vinh may be set to 9V. The erase permission voltage of 0V may be applied to all the word lines WL1 to WL32 coupled to the selected memory block Sel. BLK. In the erase inhibition strings In. ST, a voltage difference of approximately 9V may occur between the word lines WL1 to WL32 and the channel. Since the voltage difference of 9V may make it difficult to further reduce threshold voltages of memory cells that are erased, an overerase operation may be prevented from being performed on the erased memory cells.

The erase operation may be completed when all the strings in the selected memory block Sel. BLK pass the erase verification operation. When all the strings pass the erase verification operation, memory cells included in all the strings may pass the erase verification operation.

While the erase operation is being performed on the selected memory block Sel. BLK, unselected memory blocks Unsel. BLK may receive the erase voltage Verase or the erase inhibition voltage Vinh through the bit lines BL and the source lines SL. Therefore, in the unselected memory blocks Unsel.BLK, in order to prevent strings Unsel. ST from being erased, the drain turn-on voltage Vdsl may be applied to the drain selection lines DSL, the source turn-on voltage Vssl may be applied to the source selection lines SSL, and an erase prohibition voltage Vwl may be applied to the word lines WL1 to WL32.

The erase prohibition voltage Vwl may be set to a voltage of 18V, which is equal to the erase voltage Verase, or a voltage less than the drain and source turn-on voltages Vdsl and Vssl and greater than 0V. When the erase prohibition voltage Vwl is less than the drain and source turn-on voltages Vdsl and Vssl and greater than 0V, the erase prohibition voltage Vwl may be set to approximately 13.5V.

Since the erase prohibition voltage Vwl is applied to all the word lines WL1 to WL32 coupled to the unselected memory blocks Unsel. BLK, even when an erase voltage of 18V is applied to the bit lines BL, no voltage difference may occur between the word lines WL1 to WL32 and the channel. For example, when the erase prohibition voltage Vwl is the same as the erase voltage Verase, a voltage difference of 0V may occur between the word lines WL and the channel. As a result, the memory cells may not be erased. In addition, although the erase prohibition voltage Vwl is set to approximately 13.5V as described above, a voltage difference of 4.5V may exist between the word lines WL1 to WL32 and the channel. However, since the voltage difference of 4.5V may not allow the memory cells to be erased, the memory cells may be prevented from being erased.

As described above, while the erase operation is being performed on the selected strings Sel. ST, an increase in threshold voltage distribution width of the memory cells may be prevented by preventing an overerase operation of strings that are erased, and stress caused by an erase voltage that may be applied to unselected memory cells may be suppressed.

Figure 6:
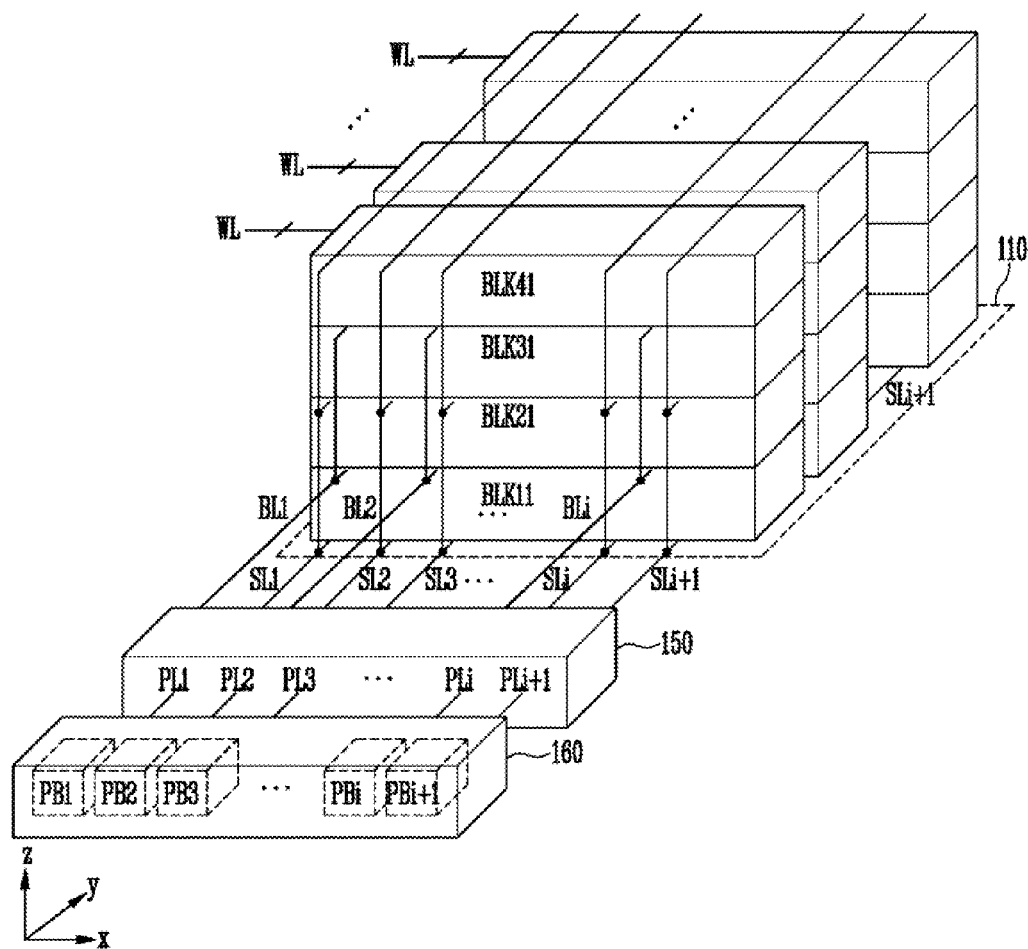
FIG. 6 is a detailed configuration illustrating a memory cell array, a selection switch unit, and a page buffer unit according to an embodiment of the present invention.

FIG. 6 is a detailed configuration illustrating a memory cell array, a selection switch unit and a page buffer unit according to an embodiment of the present invention. In FIG. 6, elements which are identical to constituent elements shown in FIG. 1 are assigned the same reference numerals, and repeated explanations thereof will be omitted or simplified.

Referring to FIG. 6, the memory cell array 110 may include a plurality of memory blocks. In the embodiment, a plurality of memory blocks having the same configuration may be arranged in a stack structure of a plurality of layers. In addition, for the convenience of explanation purposes, FIG. 6 illustrates a plurality of memory blocks arranged in a longitudinal direction (Y direction) and four memory blocks arranged by a stack structure of a plurality of layers in a vertical direction (Z direction). However, the number of memory blocks may vary depending on a semiconductor device.

The memory blocks, stacked in the vertical direction, may share the word lines WL. However, the memory blocks adjacent to each other in the longitudinal direction may not share the word lines WL. For example, when memory blocks that are arranged first in the longitudinal direction and stacked on top of one another may be defined as a first memory block BLK11, a second memory block BLK21, a third memory block BLK3 and a fourth memory block BLK41 in order in which the memory blocks are stacked in the vertical direction, the first to fourth memory blocks BLK11 to BLK41 may share the word lines WL. Therefore, the same voltages may be simultaneously applied to memory cells, which are included in the first to fourth memory blocks BLK11 to BLK41, through the word lines WL coupled in common. On the other hand, different voltages may be applied to memory blocks arranged in the longitudinal direction.

The memory blocks, which are arranged in the longitudinal direction, may share the source lines SL1 to SLi+1 and the bit lines BL1 to BLi. Memory blocks adjacent in the vertical direction, for example, the first memory block BLK11 and the second memory block BLK21 may share the bit lines BL1 to BLi and may not share the source lines SL1 to SLi+1. When the second memory block BLK21 and the first memory block BLK11 share the bit lines BL1 to BLi, the second memory block BLK21 and the third memory block BLK31 may share the source lines SL1 to SLi+1. The bit lines BL1 to BLi and the source lines SL1 to SLi+1 may be coupled in common to the selection switch unit 150, and the selection switch unit 150 may be coupled to the page buffer unit 160 through the page lines PL1 to PLi.

The page buffer unit 160 may include the plurality of page buffers PB1 to PBi+1. The page buffers PB1 to PBi+1 may correspond to the page lines PL1 to PLi+1, respectively.

Figure 7:
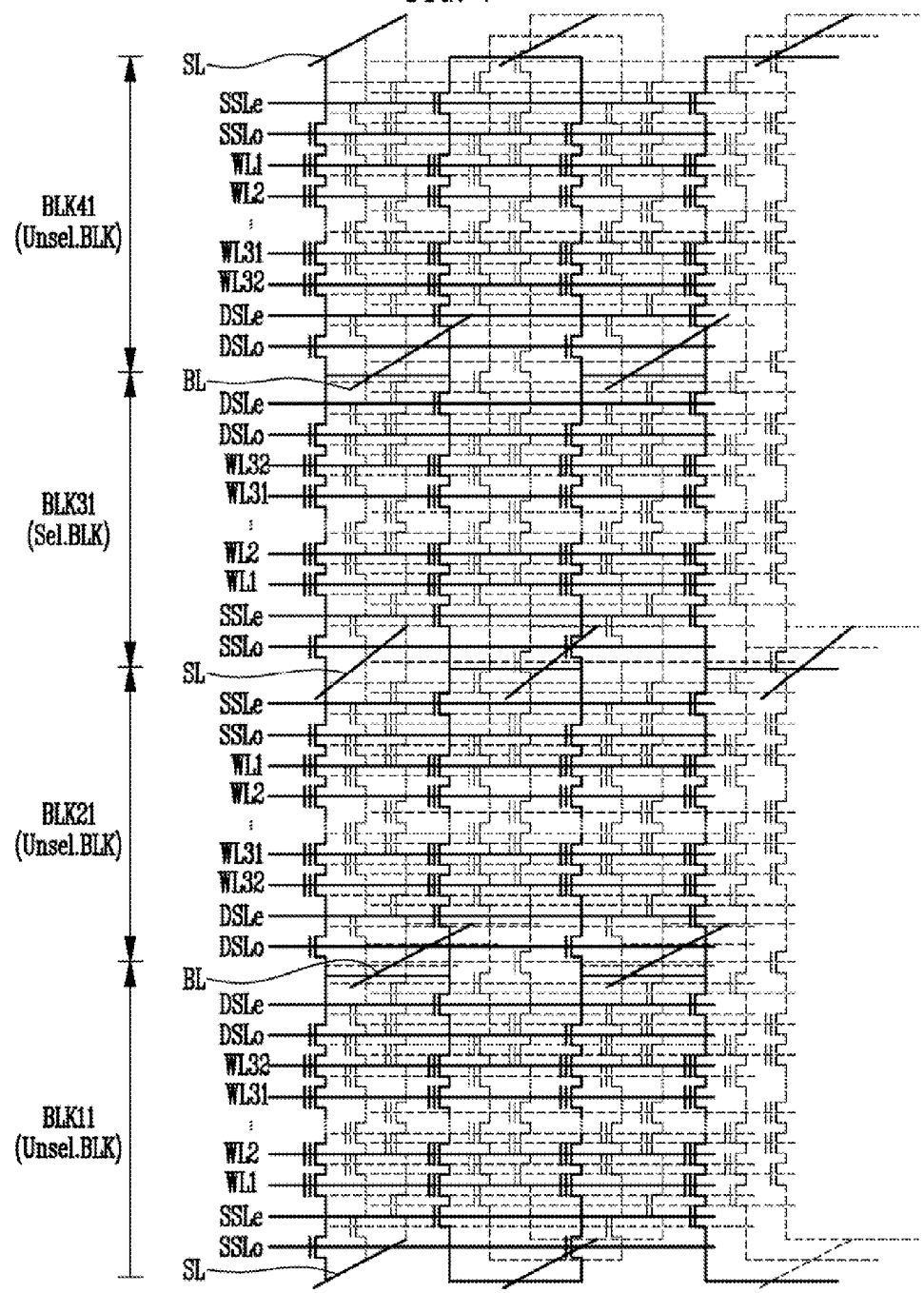
FIG. 7 is a circuit diagram illustrating memory blocks of FIG. 6.

FIG. 7 is a circuit diagram illustrating the memory blocks of FIG. 6.

In FIG. 7, the first, second, third and fourth memory blocks BLK11, BLK21, BLK31 and BLK41 that are stacked in the vertical direction may be exemplified. Each of the memory blocks may have a substantially similar structure to each of the memory blocks described above with reference to FIG. 4. Therefore, for the convenience of explanation, the arrangement of a drain selection line, a word line, a source selection line, a bit line and a source line will be described in detail.

Referring to FIG. 7, the source lines SL may be arranged at the bottom of the first memory block BLK11. An odd source selection line SSLo, an even source selection line SSLe, word lines WL1 to WL32, an odd drain selection line DSLo and an even drain selection line DSLe may be arranged in parallel with each other over the source lines SL in a vertical direction to the source lines SL. The bit lines BL may be arranged over the even drain selection line DSLe in a vertical direction to the even drain selection line DSLe. That is, the source lines SL and the bit lines BL may be arranged in parallel with each other in a longitudinal direction (Y direction).

The second memory block BLK21 may be stacked over the first memory block BLK11 and share the bit lines BL of the first memory block BLK11. Therefore, the bit lines BL may be arranged at the bottom of the second memory block BLK21. The odd drain selection line DSLo, the even drain selection line DSLe, the word lines WL32 to WL1, the odd source selection line SSLo and the even source selection line SSLe may be arranged in parallel with each other over the bit lines BL in a vertical direction to the bit lines BL. The source lines SL may be arranged over the even source selection line SSLe in a vertical direction to the even source selection line SSLe. That is, the source lines SL and the bit lines BL may be arranged in parallel with each other in the longitudinal direction (Y direction).

The third memory block BLK31 may be stacked over the second memory block BLK21 and share the source lines SL of the second memory block BLK21. Therefore, the source lines SL may be arranged at the bottom of the third memory block BLK31. The odd source selection line SSLo, the even source selection line SSLe, the word lines WL1 to WL32, the odd drain selection line DSLo and the even drain selection line DSLe may be arranged in parallel with each other over the source lines SL in the vertical direction to the source lines SL. The bit lines BL may be arranged over the even drain selection line DSLe in the vertical direction to the even drain selection line DSLe. That is, the source lines SL and the bit lines BL may be arranged in parallel with each other in the longitudinal direction (Y direction).

The fourth memory block BLK41 may be stacked over the third memory block BLK31 and share the bit lines BL of the third memory block BLK31. Therefore, the bit lines BL may be arranged at the bottom of the fourth memory block BLK41. The odd drain selection line DSLo, the even drain selection line DSLe, the word lines WL32 to WL1, the odd source selection line SSLo and the even source selection line SSLe may be arranged in parallel with each other over the bit lines BL in the vertical direction to the bit lines BL. The source lines SL may be arranged over the even source selection line SSLe in the vertical direction to the even source selection line SSLe. That is, the source lines SL and the bit lines BL may be arranged in parallel with each other in the longitudinal direction (Y direction).

In addition, as described above with reference to FIG. 5, the memory cells MC, which are included in each of the first to fourth memory blocks BLk11 to BLK41, may be divided into a first group and a second group. The first and second groups of memory blocks adjacent to each other may be symmetrical with respect to each other. For example, when the first group is located at the bottom and the second group is located at the top in the first memory block BLK11, the second group may be located at the bottom and the first group may be located at the top in the second memory block BLK21.

A program operation of the selected memory block Sel. BLK is described with reference to Table 4 below.

TABLE 4

| | | 1 | ... | 16 | 17 | ... | 32 |
|---|---|---|---|---|---|---|---|
| BLK41 (Unsel. BLK) | SL | VCC | VCC | VCC | VCC | VCC | VCC |
| | SSLe | Vss11 | Vss11 | Vss11 | Vss11 | Vss11 | Vss11 |
| | SSLo | Vss11 | Vss11 | Vss11 | Vss11 | Vss11 | Vss11 |
| | WL (First group) | Vpgm/Vpassp | Vpgm/Vpassp | Vpgm/Vpassp | Vpassp | Vpassp | Vpassp |
| | WL (Second group) | Vpassp | Vpassp | Vpassp | Vpgm/Vpassp | Vpgm/Vpassp | Vpgm/Vpassp |
| | DSLe | 0 V | 0 V | 0 V | 0 V | 0 V | 0 V |
| | DSLo | 0 V/−2 V | 0 V/−2 V | 0 V/−2 V | 0 V | 0 V | 0 V |
| | BL | VCC/0 V | VCC/0 V | VCC/0 V | VCC | VCC | VCC |
| BLK31 (Sel. BLK) | DSLe | Vds12 | Vds12 | Vds12 | 0 V | 0 V | 0 V |
| | DSLo | Vds11 | Vds11 | Vds11 | 0 V | 0 V | 0 V |
| | WL (Second group) | Vpassp | Vpassp | Vpassp | Vpgm/Vpassp | Vpgm/Vpassp | Vpgm/Vpassp |
| | WL (First group) | Vpgm/Vpassp | Vpgm/Vpassp | Vpgm/Vpassp | Vpassp | Vpassp | Vpassp |
| | SSLe | Vss11 | Vss11 | Vss11 | Vss12 | Vss12 | Vss12 |
| | SSLo | 0 V | 0 V | 0 V | Vss11 | Vss11 | Vss11 |
| | SL | VCC | VCC | VCC | VCC/0 V | VCC/0 V | VCC/0 V |
| BLK21 (Unsel. BLK) | SSLe | 0 V/−2 V | 0 V/−2 V | 0 V/−2 V | 0 V/−2 V | 0 V/−2 V | 0 V/−2 V |
| | SSLo | 0 V/−2 V | 0 V/−2 V | 0 V/−2 V | 0 V/−2 V | 0 V/−2 V | 0 V/−2 V |
| | WL (First group) | Vpgm/Vpassp | Vpgm/Vpassp | Vpgm/Vpassp | Vpassp | Vpassp | Vpassp |
| | WL (Second group) | Vpassp | Vpassp | Vpassp | Vpgm/Vpassp | Vpgm/Vpassp | Vpgm/Vpassp |
| | DSLe | Vds11 | Vds11 | Vds11 | Vds11 | Vds11 | Vds11 |
| | DSLo | Vds11 | Vds11 | Vds11 | Vds11 | Vds11 | Vds11 |
| | BL | VCC | VCC | VCC | VCC | VCC | VCC |
| BLK11 (Unsel. BLK) | DSLe | Vds11 | Vds11 | Vds11 | Vds11 | Vds11 | Vds11 |
| | DSLo | Vds11 | Vds11 | Vds11 | Vds11 | Vds11 | Vds11 |
| | WL (Second group) | Vpassp | Vpassp | Vpassp | Vpgm/Vpassp | Vpgm/Vpassp | Vpgm/Vpassp |
| | WL (First group) | Vpgm/Vpassp | Vpgm/Vpassp | Vpgm/Vpassp | Vpassp | Vpassp | Vpassp |
| | SSLe | 0 V/−2 V | 0 V/−2 V | 0 V/−2 V | 0 V/−2 V | 0 V/−2 V | 0 V/−2 V |
| | SSLo | 0 V/−2 V | 0 V/−2 V | 0 V/−2 V | 0 V/−2 V | 0 V/−2 V | 0 V/−2 V |
| | SL | VCC | VCC | VCC | VCC | VCC | VCC |

Referring to Table 4, the program operation of the selected memory block Sel. BLK may be performed by dividing memory cells into first and second groups as described above with reference to Table 1. For example, a first program operation may be performed on the memory cells of the first group in a direction from the memory cells adjacent to the source selection lines SSL to the center. Therefore, while the first program operation is being performed on the memory cells of the first group, the program voltage Vpgm or the program pass voltage Vpassp may be applied to the word lines WL coupled to the memory cells of the first group. The program pass voltage Vpassp may be applied to the word lines WL coupled to the memory cells of the second group. While a second program operation is being performed on the memory cells of the second group, the program voltage Vpgm or the program pass voltage Vpassp may be applied to the word lines WL coupled to the memory cells of the second group. The program pass voltage Vpassp may be applied to the word lines WL coupled to the memory cells of the first group.

Since the first to fourth memory blocks BLK11 to BLK41 share the word lines WL, when the program voltage Vpgm is applied to the selected word line WL of the selected memory block Sel. BLK, the program voltage Vpgm may be applied to the corresponding word line WL of the unselected memory block. Therefore, voltages applied to the bit lines BL, the source lines SL, the even and odd drain selection lines DSLe and DSLo and the even and odd source selection lines SSLe and SSLo may be controlled not to program the memory cells included in the unselected memory blocks Unsel. BLK.

The first and second program operations of the first group and the second group are described below in detail.

First Program Operation of First Group

While the first program operation is performed on the first group in the third memory block BLK31, which is the selected memory block Sel. BLK, the power voltage VCC may be applied to the source lines SL coupled to the third memory block BLK31, the source turn-off voltage of, for example, 0V may be applied to the odd source selection line SSLo, the first source turn-on voltage Vssl1 may be applied to the even source selection line SSLe, the program voltage Vpgm or the program pass voltage Vpassp may be applied to the word lines WL, the first drain turn-on voltage Vdsl1 of, for example, 4V may be applied to the odd drain selection line DSLo, the second drain turn-on voltage Vdsl2 may be applied to the even drain selection line DSLe, and the program permission voltage of, for example, 0V or the program prohibition voltage of, for example, VCC may be applied to the bit lines BL. Voltage levels of the first drain turn-on voltage Vdsl1 and the first source turn-on voltage Vssl1 may change from high to low in order to prevent channel boosting in unselected strings. For example, each of the first drain turn-on voltage Vdsl1 and the first source turn-on voltage Vssl1 may be changed from a high voltage of 4V to a low voltage of 1.5V.

In the fourth memory block BLK41, which is the unselected memory block Unsel. BLK, the drain turn-off voltage may be applied to the odd and even drain selection lines DSLo and DSLe in order to prevent reduction of a channel voltage of the fourth memory block BLK41 caused by the program permission voltage of, for example, 0V, among the voltages applied to the bit lines BL. The drain turn-off voltage may be substantially the same as the program permission voltage or be the negative voltage. For example, the drain turn-off voltage may be a voltage of 0V or −2V. The drain turn-off voltage may vary depending on a semiconductor device. The program prohibition voltage of, for example, VCC may be applied to the source lines SL coupled to the fourth memory block BLK41, and the first source turn-on voltage Vssl1 may be applied to the odd and even source selection lines SSLo and SSLe. In the beginning, the first source turn-on voltage Vssl1 may be maintained at a high voltage level in order to sufficiently transfer the program prohibition voltage to the channel through the source lines SL. Subsequently, the voltage level of the first source turn-on voltage Vssl1 may be changed to a value greater than 0V and less than the high voltage level. For example, the first source turn-on voltage Vssl1 may be reduced from 4V to 1.5V. When the first source turn-on voltage Vssl1 is reduced, the source selection transistors SST may be turned off, and channel boosting may occur in unselected strings. As a result, the memory cells of the first group, which are included in the unselected fourth memory block BLK41, may not be programmed.

In the second memory block BLK21 which is the unselected memory block Unsel. BLK, the source selection transistors SST may be turned off by applying the source turn-off voltage to the odd and even source selection lines SSLo and SSLe. For example, the source turn-off voltage may be 0V. The program prohibition voltage of, for example, VCC may be applied to the bit lines BL, which are coupled to the second memory block BLK21, and the first drain turn-on voltage Vdsl1 may be applied to the odd and even drain selection lines DSLo and DSLe, so that the channel voltage of the unselected strings of the second memory block BLK21 may be increased. The first drain turn-on voltage Vdsl may be maintained at a high voltage level in order to sufficiently transfer the program prohibition voltage to the channel through the bit lines BL. Subsequently, the first drain turn-on voltage Vdsl may be reduced to a voltage level (e.g., 1.5V) greater than 0V and less than the high voltage level. When the first drain turn-on voltage Vdsl1 is reduced, the drain selection transistors DST may be turned off, and channel boosting may occur. Accordingly, the memory cells of the first group, which are included in the unselected second memory block BLK21, may not be programmed.

In the first memory block BLK11, which is the unselected memory block Unsel. BLK, in order to prevent a reduction in channel voltage, the source selection transistors SST may be turned off by applying the power voltage VCC to the source lines SL and the source turn-off voltage of, for example, 0V or −2V to the odd and even source selection lines SSLo and SSLe. Since the program prohibition voltage of, for example, VCC is applied to the bit lines BL, the drain selection transistors DST may be turned on by applying the first drain turn-on voltage Vdsl1 to the odd and even drain selection lines DSLo and DSLe. The first drain turn-on voltage Vdsl1 may be maintained at a high voltage level in order to sufficiently transfer the program prohibition voltage to the channel through the bit lines BL. Subsequently, the first drain turn-on voltage Vdsl1 may be reduced to a value (e.g., 1.5V) greater than 0V and less than the high voltage level. When the first drain turn-on voltage Vdsl1 is reduced, the drain selection transistors DST may be turned off, and channel boosting may occur. Accordingly, the memory cells of the first group included in the unselected first memory block BLK11 may not be programmed.

Second Program Operation of Second Group

When the first program operation of the first group in the third memory block BLK31, which is the selected memory block Sel. BLK, is completed, the second program operation may be performed on the second group.

While the second program operation is being performed on the second group, the power voltage VCC may be applied to the bit lines BL coupled to the third memory block BLK31, the drain turn-off voltage of, for example, 0V may be applied to the odd and even drain selection lines DSLo and DSLe, the program voltage Vpgm or the program pass voltage Vpassp may be applied to the word lines WL, the first source turn-on voltage Vssl1 may be applied to the odd source selection line SSLo, the second source turn-on voltage Vssl2 may be applied to the even source selection line SSLe, and the program permission voltage of, for example, 0V or the program prohibition voltage of, for example, VCC may be applied to the source lines SL.

In the fourth memory block BLK41, which is the unselected memory block Unsel. BLK, the program prohibition voltage of, for example, VCC may be applied to the source lines SL, and the first source turn-on voltage Vssl1 may be applied to the odd and even source selection lines SSLo and SSLe. Since the power voltage VCC is applied to the bit lines BL, the drain turn-off voltage of, for example, 0V may be applied to the odd and even drain selection lines DSLo and DSLe. The first source turn-on voltage Vdss1 may be maintained at a high voltage level in order to sufficiently transfer the program prohibition voltage through the bit lines BL. Subsequently, the first source turn-on voltage Vdss1 may be reduced to a value (e.g., 1.5V) greater than 0V and less than the high voltage level. When the first source turn-on voltage Vssl1 is reduced, the source selection transistors SST may be turned off, and channel boosting may occur. Accordingly, the memory cells of the second group, which are included in the unselected fourth memory block BLK41, may not be programmed.

In the second memory block BLK21, which is the unselected memory block Unsel. BLK, the program prohibition voltage of, for example, VCC or the program permission voltage of, for example, 0V may be applied to the source lines SL. Therefore, the source turn-off voltage may be applied to the source selection lines SSL. The source turn-off voltage may be greater than or equal to the program permission voltage or the negative voltage. For example, the source turn-off voltage may be 0V or a negative voltage of, for example, −2V. A voltage level of the source turn-off voltage may vary depending on a semiconductor device. The program prohibition voltage of, for example, VCC may be applied to the bit lines BL coupled to the second memory block BLK21, and the first drain turn-on voltage Vdsl1 may be applied to the odd and even drain selection lines DSLo and DSLe. In the beginning, the first drain turn-on voltage Vdsl1 may be maintained at a high voltage level in order to sufficiently transfer the program prohibition voltage to the channel through the bit lines BL. Subsequently, the voltage level of the first source turn-on voltage Vssl1 may be reduced to a value (e.g., 1.5V) greater than 0V and less than the high voltage level. When the first drain turn-on voltage Vdsl1 is reduced, the odd and even drain selection transistors DSTo and DSTe may be turned off, and channel boosting may occur. As a result, the memory cells of the second group, which are included in the unselected second memory block BLK21, may not be programmed.

In the first memory block BLK11, which is the unselected memory block Unsel. BLK, in order to prevent a reduction in channel voltage, the source selection transistors SST may be turned off by applying the power voltage VCC to the source lines SL and applying the source turn-off voltage of, for example, 0V or −2V to the source selection lines SSL. Since the program prohibition voltage of, for example, VCC is applied to the bit lines BL, the drain selection transistors DST may be turned on by applying the first drain turn-on voltage Vdsl1 to the odd and even drain selection lines DSLo and DSLe. In the beginning, the first drain turn-on voltage Vdsl1 may be maintained at a high voltage level in order to sufficiently transfer the program prohibition voltage to the channel through the bit lines BL. Subsequently, the voltage level of the first drain turn-on voltage Vdsl1 may be reduced to a value (e.g., 1.5V) greater than 0V and less than the high voltage level. When the first drain turn-on voltage Vdsl1 is reduced, the drain selection transistors DST may be turned off, and channel boosting may occur. As a result, the memory cells of the second group, which are included in the unselected first memory block BLK11, may not be programmed.

A read operation of a semiconductor device will be described with reference to Table 5 below.

Referring to Table 5, the read operation of the selected memory block Sel. BLK may be performed by dividing the memory cells into first and second groups as described above with reference to Table 2. For example, the memory cells, which are included in the first group, may be read in a direction from the source lines SL to the center. The memory cells, which are included in the second group, may be read in a direction from the bit lines BL to the center. While the memory cells of the first group are being read, the read voltage Vread or the read pass voltage Vpassr may be applied to the word lines WL coupled to the memory cells of the first group, and the read pass voltage Vpassr may be applied to the word lines WL coupled to the memory cells of the second group. While the memory cells of the second group are being read, the read voltage Vread or the read pass voltage Vpassr may be applied to the word lines WL coupled to the memory cells of the second group, and the read pass voltage Vpassr may be applied to the word lines WL coupled to the memory cells of the first group. In addition, while the read operation of the selected memory block Sel. BLK is being performed, read disturbance of the selected memory block Sel. BLK may be prevented by applying the precharge voltage to the channel of the unselected memory blocks Unsel. BLK.

The voltages, which are applied to the odd and even drain selection lines DSLo and DSLe, the odd and even source selection lines SSLo and SSLe, the bit lines BL and the source lines SL, which are coupled to the unselected memory blocks Unsel. BLK during a first read operation of the first group, may also be applied to a second read operation of the second group.

TABLE 5

| | | 1 | ... | 16 | 17 | ... | 32 |
|---|---|---|---|---|---|---|---|
| BLK41 (Unsel. BLK) | SL | VCC | VCC | VCC | VCC | VCC | VCC |
| | SSLe | 4 V | 4 V | 4 V | 4 V | 4 V | 4 V |
| | SSLo | 4 V | 4 V | 4 V | 4 V | 4 V | 4 V |
| | WL (First group) | Vread/Vpassr | Vread/Vpassr | Vread/Vpassr | Vpassr | Vpassr | Vpassr |
| | WL (Second group) | Vpassr | Vpassr | Vpassr | Vread/Vpassr | Vread/Vpassr | Vread/Vpassr |
| | DSLe | 0 V | 0 V | 0 V | 0 V | 0 V | 0 V |
| | DSLo | 0 V | 0 V | 0 V | 0 V | 0 V | 0 V |
| | BL | VCC | VCC | VCC | 0 V | 0 V | 0 V |
| BLK31 (Sel. BLK) | DSLe | 0 V | 0 V | 0 V | 0 V | 0 V | 0 V |
| | DSLo | 4 V | 4 V | 4 V | 4 V | 4 V | 4 V |
| | WL (Second group) | Vpassr | Vpassr | Vpassr | Vread/Vpaasr | Vread/Vpassr | Vread/Vpassr |
| | WL (First group) | Vread/Vpassr | Vread/Vpassr | Vread/Vpassr | Vpassr | Vpassr | Vpassr |
| | SSLe | 0 V | 0 V | 0 V | 0 V | 0 V | 0 V |
| | SSLo | 4 V | 4 V | 4 V | 4 V | 4 V | 4 V |
| | SL | 0 V | 0 V | 0 V | VCC | VCC | VCC |
| BLK21 (Unsel. BLK) | SSLe | 0 V | 0 V | 0 V | 0 V | 0 V | 0 V |
| | SSLo | 0 V | 0 V | 0 V | 0 V | 0 V | 0 V |
| | WL (First group) | Vread/Vpassr | Vread/Vpassr | Vread/Vpassr | Vpassr | Vpassr | Vpassr |
| | WL (Second group) | Vpassr | Vpassr | Vpassr | Vread/Vpassr | Vread/Vpassr | Vread/Vpassr |
| | DSLe | 4 V | 4 V | 4 V | 4 V | 4 V | 4 V |
| | DSLo | 4 V | 4 V | 4 V | 4 V | 4 V | 4 V |
| | BL | VCC | VCC | VCC | VCC | VCC | VCC |
| BLK11 (Unsel. BLK) | DSLe | 4 V | 4 V | 4 V | 4 V | 4 V | 4 V |
| | DSLo | 4 V | 4 V | 4 V | 4 V | 4 V | 4 V |
| | WL (Second group) | Vpassr | Vpassr | Vpassr | Vread/Vpassr | Vread/Vpassr | Vread/Vpassr |
| | WL (First group) | Vread/Vpassr | Vread/Vpassr | Vread/Vpassr | Vpassr | Vpassr | Vpassr |
| | SSLe | 0 V | 0 V | 0 V | 0 V | 0 V | 0 V |
| | SSLo | 0 V | 0 V | 0 V | 0 V | 0 V | 0 V |
| | SL | 0 V | 0 V | 0 V | 0 V | 0 V | 0 V |

The read operation of memory cells, which are included in odd-numbered strings, is described below.

While the first read operation is being performed on the first group in the third memory block BLK31, which is the selected memory block Sel. BLK, 0V, may be applied to the source lines SL coupled to the third memory block BLK31, the source turn-on voltage of, for example, 4V may be applied to the odd source selection line SSLo, the source turn-off voltage of, for example, 0V may be applied to the even source selection line SSLe, the read voltage Vread or the read pass voltage Vpassr may be applied to the word lines WL, the drain turn-on voltage of, for example, 4V may be applied to the odd drain selection line DSLo, and the drain turn-off voltage of, for example, 0V may be applied to the even drain selection line DSLe, and the precharge voltage may be applied to the bit lines BL.

When 0V is applied to the source lines SL, the source lines SL may be connected to a ground terminal. A positive voltage having a voltage level different from 4V may be used as the drain and source turn-on voltages. The precharge voltage may be set to a positive voltage such as the power voltage VCC or a voltage of 1V.

After the first read operation of the first group is completed, the second read operation of the second group may be performed. During the second read operation of the second group, the precharge voltage may be applied to the source lines SL coupled to the third memory block BLK31, the source turn-on voltage of, for example, 4V may be applied to the odd source selection line SSLo, the source turn-off voltage of, for example, 0V may be applied to the even source selection line SSLe, the read voltage Vread or the read pass voltage Vpassr may be applied to the odd drain selection line DSLo, the drain turn-on voltage of, for example, 4V may be applied to the word lines WL, the drain turn-off voltage of, for example, 0V may be applied to the even drain selection line DSLe, and 0V may be applied to the bit lines BL.

When 0V is applied to the bit lines BL, the bit lines BL may be connected to a ground terminal. A positive voltage having a voltage level different from 4V may be used as the drain and source turn-on voltages. The precharge voltage may be set to a positive voltage such as the power voltage VCC or a voltage of 1V.

During the read operations of the first and second groups in the selected memory block Sel. BLK, in the fourth memory block BLK41, which is the unselected memory block Unsel. BLK, the drain turn-off voltage of, for example, 0V may be applied to the odd and even drain selection lines DSLo and DSLe, the precharge voltage of VCC may be applied to the source lines SL, and the source turn-on voltage of, for example, 4V may be applied to the odd and even source selection lines SSLo and SSLe.

In the second memory block BLK21, which is the unselected memory block Unsel. BLK, the source turn-off voltage of, for example, 0V may be applied to the odd and even source selection lines SSLo and SSLe, the drain turn-on voltage of, for example, 4V may be applied to the odd and even drain selection lines DSLo and DSLe, and the precharge voltage may be applied to the bit lines BL.

In the first memory block BLK11, which is the unselected memory block Unsel. BLK, the drain turn-on voltage of, for example, 4V may be applied to the odd and even drain selection lines DSLo and DSLe, 0V may be applied to the source lines SL, and the source turn-off voltage of, for example, 0V may be applied to the odd and even source selection lines SSLo and SSLe. Since the above-described voltage levels of the drain and source turn-off voltages, the drain and source turn-off voltages and the precharge voltage are provided for understanding of the scope of the invention, these voltage levels may vary depending on a semiconductor device.

An erase operation of a semiconductor device is described below with reference to Table 6 below.

TABLE 6

|  |  | Sel. ST | In. ST | Unsel. BLK |
|---|---|---|---|---|
| BLK41 (Unsel. BLK) | SL | FT | FT | FT |
|  | SSLe | 0 V | 0 V | — |
|  | SSLo | 0 V | 0 V | — |
|  | SSL | — | — | Vssl |
|  | WL | 0 V | 0 V | Vwl |
|  | DSLe | 0 V | 0 V | — |
|  | DSLo | 0 V | 0 V | — |
|  | DSL | — | — | Vdsl |
|  | BL | Verase | Vinh | Verase/Vinh |
| BLK31 (Sel. BLK) | DSLe | Vdsl/0 V | Vdsl/0 V | — |
|  | DSLo | Vdsl | Vdsl | — |
|  | DSL | — | — | Vdsl |
|  | WL | 0 V | 0 V | Vwl |
|  | SSLe | Vssl/0 V | Vssl/QV | — |
|  | SSLo | Vssl | Vssl | — |
|  | SSL | — | — | Vssl |
|  | SL | Verase | Vinh | Verase/Vinh |
| BLK21 (Unsel. BLK) | SSLe | 0 V | 0 V | — |
|  | SSLo | 0 V | 0 V | — |
|  | SSL | — | — | Vssl |
|  | WL | 0 V | 0 V | Vwl |
|  | DSLe | 0 V | 0 V | — |
|  | DSLo | 0 V | 0 V | — |
|  | DSL | — | — | Vdsl |
|  | BL | FT | FT | FT |
| BLK11 (Unsel. BLK) | DSLe | 0 V | 0 V | — |
|  | DSLo | 0 V | 0 V | — |
|  | DSL | — | — | Vdsl |
|  | WL | 0 V | 0 V | Vwl |
|  | SSLe | 0 V | 0 V | — |
|  | SSLo | 0 V | 0 V | — |
|  | SSL | — | — | Vssl |
|  | SL | Verase | Verase | Verase |

Referring to Table 6, when the erase operation starts, the erase voltage Verase may be applied to all the bit lines BL and all the source lines SL coupled to the selected memory block Sel. BLK, and the erase permission voltage may be applied to the word lines WL coupled to the selected memory block Sel. BLK. For example, a voltage of 18V may be used as the erase voltage Verase, and a voltage of 0V may be used as the erase permission voltage. When the voltage of 0V is applied to the word lines WL, the word lines WL may be connected to a ground terminal. As described above with reference to FIG. 6, since the memory blocks BLK11, BLK21, BLK31 and BLK41 that are vertically stacked may share the word lines WL with each other, the erase permission voltage of, for example, 0V may be applied to the word lines WL in the unselected memory blocks BLK11, BLK21 and BLK41 that share the word lines WL with the selected memory block Sel. BL. Therefore, in the unselected memory blocks BLK11, BLK21 and BLK41, it may be important to control the voltages applied to the bit lines BL, the source lines SL, the odd and even drain selection lines DSLo and DSLe, and the odd and even source selection lines SSLo and SSLe.

More specifically, the erase operation may be performed using an ISPE method. When the erase operation starts, all strings included in the selected memory block Sel. BLK may be selected strings Sel. ST to be erased. Therefore, when the erase operation starts, the erase voltage Verase may be applied to all the bit lines BL and all the source lines SL, which are coupled to the selected memory block Sel. BLK, the drain turn-on voltage Vdsl may be applied to the odd and even drain selection lines DSLo and DSLe, the erase permission voltage may be applied to the word lines WL, and the source turn-on voltage Vssl may be applied to the even and odd source selection line SSLo and SSLe.

Alternatively, since drain selection transistors DST and source selection transistors SST that are included in odd-numbered strings and even-numbered strings may be separately operated, only the memory cells included in the odd-numbered (or even-numbered) strings may be selectively erased. For example, the erase voltage Verase being applied to the bit lines BL and the source lines SL may be prevented from being applied to the channel of the even-numbered strings by applying the drain turn-off voltage of 0V to the even drain selection line DSLe and the even source selection line SSLe coupled to the drain selection transistors DST of the even-numbered strings.

The erase operation may include applying an erase voltage and performing an erase verification operation. As described above, after the erase voltage Verase is applied to the strings through the bit lines BL and the source lines SL, the erase verification operation may be performed. As a result of the erase verification operation, when strings that are erased are detected among the strings in the selected memory block Sel. BLK, the corresponding strings may be defined as erase inhibition strings In. ST. While the erase operation is being performed on the selected strings Sel. ST not completely erased, the erase inhibition voltage Vinh may be applied to the bit lines BL and the source lines SL coupled to the erase inhibition strings In. ST in order to prevent an excessive reduction of threshold voltages of the memory cells included in the erase inhibition strings In. ST. The erase inhibition voltage Vinh may be greater than 0V and less than the erase voltage Verase. The erase inhibition voltage Vinh may correspond to approximately half of the erase voltage Verase. In other words, when it is assumed that the erase voltage Verase is 18V, the erase inhibition voltage Vinh may be set to 9V. When the erase inhibition voltage Vinh is applied to the bit lines BL and the source lines SL of the erase inhibition strings In. ST, even when a voltage of 0V, i.e., the erase permission voltage is applied to the word lines WL, a small voltage difference of 9V may occur between the word lines WL and the channel. As a result, an excessive reduction in the threshold voltages of the memory cells may be prevented.

Operations of the first memory block BLK11, the second memory block BLK21 and the fourth memory block BLK41 that share the word lines WL coupled to the selected memory block Sel. BLK during the erase operation of on the selected memory block Sel. BLK will be described below in detail.

In the fourth memory block BLK41, a drain turn-off voltage may be applied to the drain selection lines DSLo, DSLe and DSL, regardless of voltages applied to the bit lines BL. The drain turn-off voltage may be 0V or a negative voltage. When the negative voltage is used as the drain turn-off voltage, a negative voltage of approximately −2V may be used. Since the source lines SL of the fourth memory block BLK41 are not shared by other memory blocks, the source lines SL may be floated (FT), and the source turn-off voltage may be applied to the source selection lines SSLo, SSLe and SSL.

In the second memory block BLK21, the source turn-off voltage may be applied to the source selection lines SSLo, SSLe and SSL, regardless of voltages applied to the source lines SL. As the source turn-off voltage, 0V or a negative voltage may be applied. When the negative voltage is used as the source turn-off voltage, a negative voltage of, for example, approximately −2V may be used, and leakage in the source selection transistors SST may be prevented. The bit lines BL of the second memory block BLK21 may be floated, and the drain turn-off voltage may be applied to the drain selection lines DSLo, DSLe and DSL.

In the first memory block BLK11, drain and source turn-off voltages may be applied to the drain and source selection lines DSL and SSL, and the erase voltage Verase may be applied to the source lines SL. The drain and source turn-off voltages may be 0V or a negative voltage. When the negative voltage is used as the drain and source turn-off voltages, a negative voltage of approximately −2V may be used, and leakage in the source selection transistors SST may be prevented.

Operations of the unselected memory blocks Unsel. BLK that do not share the word lines WL, which are coupled to the selected memory block Sel. BLK, during the erase operation of the selected memory block Sel. BLK will be described below in detail.

In a memory block that shares the bit lines BL and the source lines SL of the selected memory block Sel. BLK, among the unselected memory blocks Unsel. BLK, the drain and source selection transistors DST and SST may be turned on by applying the drain turn-on voltage Vdsl to the drain selection lines DSL and applying the source turn-on voltage Vssl to the source selection lines SSL. When the drain and source selection transistors are turned on, the erase voltage Verase may be applied to the channel of the strings. Therefore, the memory cells may be prevented from being erased by applying the erase prohibition voltage Vwl to the word lines WL coupled to the unselected memory blocks Unsel. BLK. The erase voltage Verase may be applied to the bit lines BL and the source lines SL coupled to the other unselected memory blocks Unsel. BLK. The drain turn-on voltage Vdsl may be applied to the drain selection lines DSL. The source turn-on voltage Vssl may be applied to the source selection lines SSL. The erase prohibition voltage Vwl may be applied to the word lines WL. Accordingly, the memory cells, which are included in the unselected memory blocks Unsel. BLK, may be prevented from being erased, and stress caused by the erase voltage Verase may be reduced.

Figure 8:
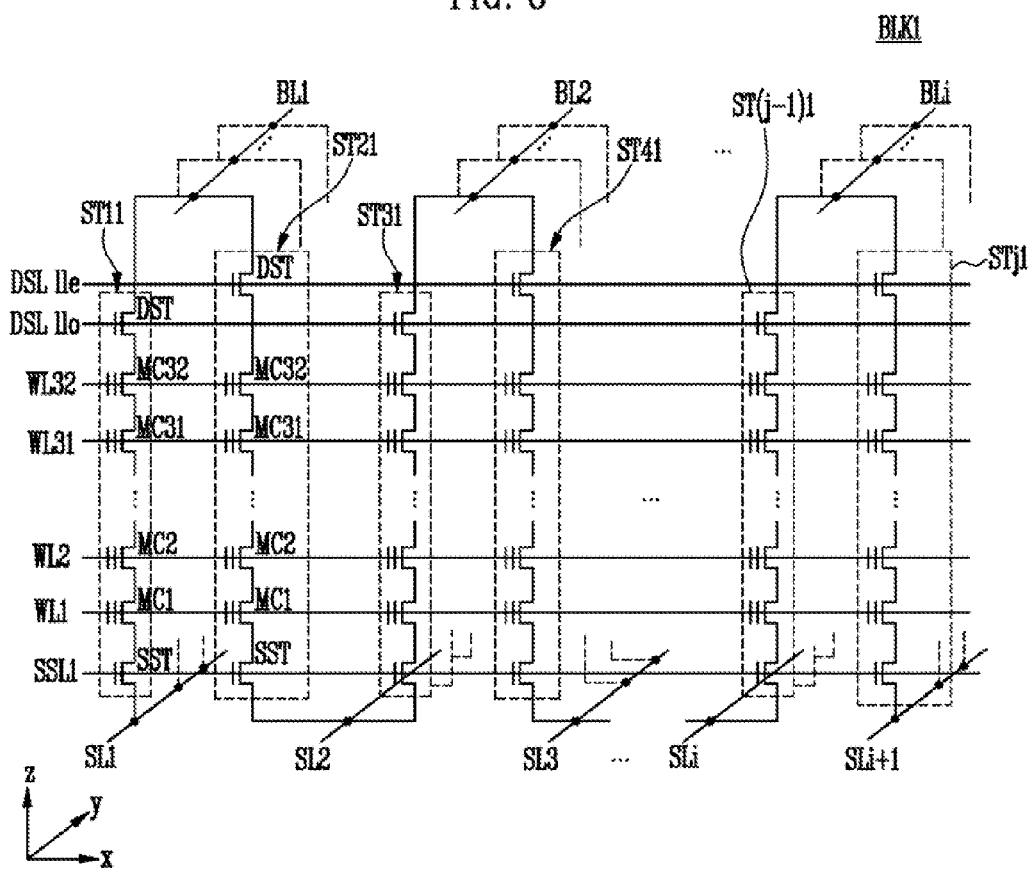
FIG. 8 is a circuit diagram illustrating memory blocks in a transverse direction according to a third embodiment of the present invention.

FIG. 8 is a circuit diagram Illustrating a memory block in a transverse direction according to an embodiment of the present invention.

Referring to FIG. 8, the memory block according to the embodiment may include a plurality of odd-numbered strings and a plurality of even-numbered strings. The odd-numbered strings and the even-numbered strings may not share drain selection lines with each other and may share source selection lines with each other. Among the plurality of memory blocks, the first memory block BLK1 will be described as an example in detail.

The first memory block BLK1 may include a plurality of strings that are arranged in a transverse direction (X direction) and a longitudinal direction (Y direction). Each of the strings may include the drain selection transistor DST, the memory cells MC1 to MC32 and the source selection transistor SST that are coupled in series with each other. Gates of the drain selection transistors DST may be coupled to the first odd drain selection line DSL11*o* or the first even drain selection line DSL11*e*. Gates of the memory cells MC1 to MC32 may be coupled to the word lines WL1 to WL32, and gates of the source selection transistors SST may be coupled to the source selection lines SSL1. For example, the gates of the drain selection transistors DST, which are included in the strings adjacent to each other in the transverse direction (X direction), may be coupled to the drain selection lines DSL11*o* or DSL11*e*. The gates of the source selection transistors SST, which are included in the strings adjacent to each other in the transverse direction (X direction), may share the source selection lines SSL1 with each other.

The first to fourth strings arranged in the transverse direction (X direction) may be referred to as the first to fourth strings ST11 to ST41, respectively. The first source line SL1 may be coupled to the first string ST11. The first bit line BL1 may be coupled in common to the first and second strings ST11 and ST21. The second source line SL2 may be coupled in common to the second and third strings ST21 and ST31. The second bit line BL2 may be coupled in common to the third and fourth strings ST31 and ST41. The i-th bit line BLi may be coupled to the last string STj1, j being i*2 among the strings arranged in the transverse direction (X direction) and a string ST(j−1)1 prior to the last string STj1. The i+1-th source line SLi+1 may be coupled to the last string STj1.

When the gate of the drain selection transistor DST, which is included in the first string ST11, is coupled to the odd drain selection lines DSL11o, the gate of the drain selection transistor DST, which is included in the second string ST21, may be coupled to the even drain selection lines DSL11e. In other words, the gates of the drain selection transistors DST, which are included in the odd-numbered strings ST11, ST31, ST51, . . . , arranged in the transverse direction (X direction), may be coupled in common to the odd drain selection line DSL11o. The gates of the even drain selection lines DSL11e, which are included in the even-numbered strings ST21, ST41, ST61, . . . , may be coupled in common to the even drain selection line DSL11e. The gates of the source selection transistors SST, which are included in the odd-numbered strings ST11, ST31, ST51, . . . arranged in the transverse direction (X direction), may be coupled in common to the source selection line SSL1.

A program operation of a semiconductor device including a plurality of strings, each of which includes 32 memory cells, will be described with reference to Table 7 below.

i.e., in an upward direction. A second program operation may be performed on the memory cells included in the second group WLu in a reverse direction, i.e., in a downward direction. More specifically, the memory cells, which are included in the first group WLd, may be sequentially programmed from the memory cells adjacent to the source lines SL to the memory cells located at the center. The memory cells, which are included in the second group WLu, may be sequentially programmed from the memory cells adjacent to the bit lines BL to the memory cells located at the center. In other words, the memory cells, coupled to the first word line WL1, may be coupled to the source line SL, and the memory cells, coupled to the 32nd word line WL32, may be adjacent to the bit lines BL.

The first program operations of the first group WLd and the second program operation of the second group WLu will be described below in detail.

First Program Operation of First Group WLd

The first program operation of the selected memory cells, which are included in the first group WLd, may be sequentially performed from the first memory cells MC1 adjacent to the source lines SL to the 16th memory cells.

During the first program operation of the first group WLd, in order to prevent leakage of a channel voltage, the power voltage Vcc may be applied to the source lines SL, and the program permission voltage or the program prohibition voltage may be applied to the bit lines BL. Channels may be formed in the strings by applying the program pass voltage Vpassp to the first to 32nd word lines WL1 to WL32. The source turn-off voltage of 0V may be applied to the source selection lines SSL1. The drain turn-on voltages Vdsl1 and Vdsl2 may be applied to the odd and even drain selection lines DSL11o and DSL11e, respectively. More specifically, the

TABLE 7

|  | 1 | 2 | ... | 15 | 16 | 17 | 18 | ... | 31 | 32 |
|---|---|---|---|---|---|---|---|---|---|---|
| BL | Vcc/0 V | Vcc/0 V | Vcc/0 V | Vcc/0 V | Vcc/0 V | Vcc/0 V | Vcc/0 V | Vcc/0 V | Vcc/0 V | Vcc/0 V |
| DSL11e | Vdsl2 | Vdsl2 | Vdsl2 | Vdsl2 | Vdsl2 | Vdsl2 | Vdsl2 | Vdsl2 | Vdsl2 | Vdsl2 |
| DSL11o | Vdsl1 | Vdsl1 | Vdsl1 | Vdsl1 | Vdsl1 | Vdsl1 | Vdsl1 | Vdsl1 | Vdsl1 | Vdsl1 |
| WL32 | Vpassp | Vpassp | Vpassp | Vpassp | Vpassp | Vpgm | Vpassp | Vpassp | Vpassp | Vpassp |
| WL31 | Vpassp | Vpassp | Vpassp | Vpassp | Vpassp | Vpassp | Vpgm | Vpassp | Vpassp | Vpassp |
| ... | Vpassp | Vpassp | Vpassp | Vpassp | Vpassp | Vpassp | Vpassp | ... | Vpassp | Vpassp |
| WL18 | Vpassp | Vpassp | Vpassp | Vpassp | Vpassp | Vpassp | Vpassp | Vpassp | Vpgm | Vpassp |
| WL17 | Vpassp | Vpassp | Vpassp | Vpassp | Vpassp | Vpassp | Vpassp | Vpassp | Vpassp | Vpgm |
| WL16 | Vpassp | Vpassp | Vpassp | Vpassp | Vpgm | Vpassp | Vpassp | Vpassp | Vpassp | Vpassp |
| WL15 | Vpassp | Vpassp | Vpassp | Vpgm | Vpassp | Vpassp | Vpassp | Vpassp | Vpassp | Vpassp |
| ... | Vpassp | Vpassp | ... | Vpassp | Vpassp | Vpassp | Vpassp | Vpassp | Vpassp | Vpassp |
| WL2 | Vpassp | Vpgm | Vpassp | Vpassp | Vpassp | Vpassp | Vpassp | Vpassp | Vpassp | Vpassp |
| WL1 | Vpgm | Vpassp | Vpassp | Vpassp | Vpassp | Vpassp | Vpassp | Vpassp | Vpassp | Vpassp |
| SSL1 | 0 V | 0 V | 0 V | 0 V | 0 V | 0 V | 0 V | 0 V | 0 V | 0 V |
| SL | Vcc | Vcc | Vcc | Vcc | Vcc | Vcc | Vcc | Vcc | Vcc | Vcc |

The program operation may be performed by dividing the memory cells, which are included in the strings, into two groups. The memory cells may be programmed from the memory cells adjacent to the source lines SL to the memory cells located around the center. Subsequently, the memory cells may be sequentially programmed from the memory cells adjacent to the bit lines BL to the memory cells located near the center. For example, the first to 16th memory cells may be defined as the first group WLd, and the 17th to 32nd memory cells may be defined as the second group WLu. After the memory cells, which are included in the first group WLd, may be programmed, the memory cells, which are included in the second group WLu, may subsequently be programmed. A first program operation may be performed on the memory cells included in the first group WLd in a forward direction first drain turn-on voltage Vdsl1 may be applied to the odd drain selection lines DSL11o, and the second drain turn-on voltage Vdsl2 may be applied to the even drain selection lines DSL11e. After the channels are formed in the strings, the first drain turn-on voltage Vdsl1 and the second drain turn-on voltage Vdsl2 may be reduced from a high voltage level to a low voltage level so that channel boosting may occur in unselected strings.

A description will be made in reference to an example in which the odd-numbered strings ST11, ST31, . . . are selected strings to be programmed and the even-numbered strings ST21, ST41, . . . are unselected strings not to be programmed. Each of the first drain turn-on voltage Vdsl1 and the second drain turn-on voltage Vdsl2 may have a voltage level of approximately 4V, so that a channel may be formed in the strings. Subsequently, the first drain turn-on voltage Vdsl1 may be reduced to a voltage level of approximately 1.5V, so that the program permission voltage or the program prohibition voltage may be applied to the selected strings. In addition, the drain turn-off voltage may be applied as the second drain turn-on voltage Vdsl2. For example, by reducing the drain turn-off voltage to 0V or a negative voltage of, for example, −2V, channel boosting may occur in the unselected strings caused by the program pass voltage Vpassp and the program prohibition voltage.

Subsequently, selected memory cells, among the first memory cells MC1 included in the odd-numbered strings ST11, ST31, . . . , may be programmed by applying the program voltage Vpgm to the selected first word line WL1. The program voltage applying operation and the program verification operation may be repeated until all the first memory cells MC1 pass the program verification operation. When the first memory cells MC1 pass the program verification operation, the other memory cells, which are included in the first group WLd, may be sequentially programmed from the second memory cells MC2 to the 16th memory cells MC16 by using the above-described method.

Second Program Operation of Second Group WLu

When the first program operation of the selected memory cells, which are included in the first group WLd, is completed, the second program operation may be performed on selected memory cells included in the second group WLu.

The second program operation may be sequentially performed on the selected memory cells of the second group WLu in a direction from the 32nd memory cells MC32 adjacent to the first odd drain selection line DSL11o towards the 17th memory cells MC17 located at the center of the string. The program permission voltage or the program prohibition voltage may be applied to the bit lines BL. The power voltage Vcc may be applied to the source lines SL in order to prevent leakage of a channel voltage. The program pass voltage Vpassp may be applied to the first to 32nd word lines WL1 to WL32 to form channels in the strings. The source turn-off voltage of 0V may be applied to the source selection lines SSL1. The drain turn-on voltages Vdsl1 and Vdsl2 may be applied to the odd and even drain selection lines DSL11o and DSL11e, respectively. Subsequently, the 32nde memory cells MC32 may be programmed by applying the program voltage to the 32nd word line WL32. When the 32nd memory cells MC32 pass the program verification operation, the 31st to 17th memory cells MC31 to MC17 may be sequentially programmed.

A read operation of a semiconductor device is described with reference to Table 8 below.

Referring to Table 8, the read operation may be performed by dividing memory cells, which are included in strings, into two groups. For example, when a single string may include 32 memory cells, the first to 16th memory cells may be defined as the first group WLd, and the 17th to 32nd memory cells may be defined as the second group WLu. A first read operation may be performed on the memory cells, which are included in the first group WLd, in a forward direction, i.e., an upward direction. A second read operation may be performed on the memory cells, which are included in the second group WLu, in a reverse direction, i.e., a downward direction. More specifically, the memory cells, which are included in the first group WLd, may be read in a direction from the source lines SL to the center. The memory cells, which are included in the second group WLu, may be read in a direction from the bit lines BL to the center.

Different voltages may be applied to the source lines SL and the bit lines BL during the first read operation of the first group WLd and the second read operation of the second group WLu, which is described below in detail.

First Read Operation of First Group WLd

The first read operation of the memory cells, which are included in the first group WLd, may be performed from the first memory cells MC1 adjacent to the source selection lines SSL1 to the 16th memory cells MC16 located at the center of the string.

During the first read operation of the first group WLd, 0V may be applied to the source lines SL, and the precharge voltage (power voltage VCC or 1V) may be applied to the bit lines BL. A source turn-on voltage of, for example, 4V may be applied to the source selection lines SSL1. A drain turn-on voltage of, for example, 4V may be applied to the odd drain selection lines DSL11o. A turn-off voltage of, for example, 0V may be applied to the even drain selection line DSLe coupled to even-numbered strings not to be read. After channels are formed in the strings by applying the read pass voltage Vpassr to the first to 32nd word lines WL1 to WL32, the first memory cells MC1 may be read by applying the read voltage Vread to the first word line WL1. In this manner, the second to 16th memory cells MC2 to MC16, which are included in the first group WLd, may be sequentially read.

Second Read Operation of Second Group WLu

When the first read operation of the memory cells, which are included in the first group WLd, is completed, the second read operation may be performed on the memory cells included in the second group WLu.

The second read operation of the memory cells, which are included in the second group WLu, may be sequentially per-

TABLE 8

|  | 1 | 2 | ... | 15 | 16 | 17 | 18 | ... | 31 | 32 |
|---|---|---|---|---|---|---|---|---|---|---|
| BL | VCC | VCC | VCC | VCC | VCC | 0 V | 0 V | 0 V | 0 V | 0 V |
| DSL11e | 0 V | 0 V | 0 V | 0 V | 0 V | 0 V | 0 V | 0 V | 0 V | 0 V |
| DSL11o | 4 V | 4 V | 4 V | 4 V | 4 V | 4 V | 4 V | 4 V | 4 V | 4 V |
| WL32 | Vpassr | Vpassr | Vpassr | Vpassr | Vpassr | Vread | Vpassr | Vpassr | Vpassr | Vpassr |
| WL31 | Vpassr | Vpassr | Vpassr | Vpassr | Vpassr | Vpassr | Vread | Vpassr | Vpassr | Vpassr |
| ... |  | Vpassr | Vpassr | Vpassr | Vpassr | Vpassr | Vpassr | ... | Vpassr | Vpassr |
| WL18 | Vpassr | Vpassr | Vpassr | Vpassr | Vpassr | Vpassr | Vpassr | Vpassr | Vread | Vpassr |
| WL17 | Vpassr | Vpassr | Vpassr | Vpassr | Vpassr | Vpassr | Vpassr | Vpassr | Vpassr | Vread |
| WL16 | Vpassr | Vpassr | Vpassr | Vpassr | Vread | Vpassr | Vpassr | Vpassr | Vpassr | Vpassr |
| WL15 | Vpassr | Vpassr | Vpassr | Vread | Vpassr | Vpassr | Vpassr | Vpassr | Vpassr | Vpassr |
| ... |  | Vpassr | Vpassr | ... | Vpassr | Vpassr | Vpassr | Vpassr | Vpassr | Vpassr |
| WL2 | Vpassr | Vread | Vpassr | Vpassr | Vpassr | Vpassr | Vpassr | Vpassr | Vpassr | Vpassr |
| WL1 | Vread | Vpassr | Vpassr | Vpassr | Vpassr | Vpassr | Vpassr | Vpassr | Vpassr | Vpassr |
| SSL1 | 4 V | 4 V | 4 V | 4 V | 4 V | 4 V | 4 V | 4 V | 4 V | 4 V |
| SL | 0 V | 0 V | 0 V | 0 V | 0 V | VCC | VCC | VCC | VCC | VCC | formed from the 32nd memory cells MC32 adjacent to the odd drain selection lines DSL11o to the 17th memory cells MC17 located at the center of the string.

During the second read operation of the second group WLu, 0V may be applied to the bit lines BL, and the precharge voltage (power voltage VCC or 1V) may be applied to the source lines SL. A source turn-on voltage of, for example, 4V may be applied to the source selection lines SSL1. A drain turn-on voltage of, for example, 4V may be applied to the odd drain selection lines DSL11o. A turn-off voltage of, for example, 0V may be applied to the even drain selection line DSLe coupled to even-numbered strings not to be programmed. The 32nd memory cells MC32 may be read by applying the read voltage Vread to the 32nd word line WL32. The 31st to 17th memory cells MC31 to MC17, which are included in the second group WLu, may be sequentially read.

The second read operation may be performed by sensing variations of voltages of the bit lines BL or the source lines SL. Since the sensing method is known in the art, a detailed description thereof will be omitted.

An erase operation of the first memory block BLK1 of FIG. 8 will be described as an example with reference to Table 9 below.

TABLE 9

| | Sel. BLK | | Unsel. BLK |
|---|---|---|---|
| | Sel. ST | In. ST | Unsel. ST |
| BL | Verase | Vinh | Verase/Vinh |
| DSL11e | Vdsl/0 V | Vdsl/0 V | — |
| DSL11o | Vdsl | Vdsl | — |
| DSL | — | — | Vdsl |
| WL32 | 0 V | 0 V | Vwl |
| ... | 0 V | 0 V | Vwl |
| WL1 | 0 V | 0 V | Vwl |
| SSL1 | Vssl | Vssl | — |
| SSL | — | — | Vssl |
| SL | Verase | Vinh | Verase/Vinh |

Referring to Table 9, when the erase operation starts, the erase voltage Verase may be applied to all the bit lines BL and all the source lines SL coupled to the selected memory block Sel. BLK.

The drain turn-on voltage Vdsl may be applied to the odd drain selection lines DSL11o and the even drain selection lines DSL11e coupled to the selected memory block Sel. BLK. The source turn-on voltage Vssl may be applied to the source selection lines SSL1. The erase permission voltage of, for example, 0V may be applied to the word lines WL1 to WL32. Thus, the memory cells MC1 to MC32, which are included in the selected memory block Sel. BLK, may be erased.

Alternatively, since the drain selection transistors DST, which are included in odd-numbered strings or even-numbered strings, may be separately operated, only memory cells included in the odd-numbered (or even-numbered) strings may be selectively erased. For example, the erase voltage Verase being applied to the bit lines BL and the source lines SL may be prevented from being applied to a channel of the even-numbered strings by applying the drain turn-off voltage of 0V to the even drain selection lines DSL11e coupled to the drain selection transistors DST of the even-numbered strings.

For example, the erase voltage Verase may be 18V, the drain and source turn-on voltages Vdsl and Vssl may be set to 15V, and the erase permission voltage may be set to 0V. However, these voltage levels are provided for understanding of the scope of the present invention. The voltage levels may vary depending on a semiconductor device.

Since the erase operation is performed using an ISPE method, after the erase voltage Verase is applied to the channel through the bit lines BL and the source lines SL during an erase voltage applying operation, an erase verification operation may be performed. The erase verification operation may be performed in units of strings. More specifically, the erase verification operation may be performed in units of strings coupled in common to the bit lines BL.

Strings having passed the erase verification operation may be defined as the erase inhibition strings In. ST. The strings ST having not passed the erase verification operation may be defined as the selected strings Sel. ST. Therefore, when the erase operation starts, all of the strings, which are included in the selected memory block Sel. BLK, may be the selected strings Sel. ST. While the erase operation is being performed, some of the selected strings Sel. ST may be changed to the erase inhibition strings In. ST based on the erase verification operation.

After the erase inhibition strings In. ST are generated, the erase operation may be performed while applying the erase inhibition voltage Vinh to the bit lines BL and the source lines SL coupled to the erase inhibition strings In. ST. In other words, when the erase operation is performed on the selected strings Sel. ST, threshold voltages of the memory cells, which are included in the erase inhibition strings In. ST, may be prevented from being further reduced by applying the erase inhibition voltage Vinh to the erase inhibition strings In. ST. To this end, the erase inhibition voltage Vinh may be set to be less than the erase voltage Verase. More specifically, the erase inhibition voltage Vinh may be set to half of the erase voltage Verase. For example, when the erase voltage Verase is 18V, the erase inhibition voltage Vinh may be set to 9V. Since an erase permission voltage of 0V may be applied to the word lines WL1 to WL32 coupled to the selected memory block Sel. BLK, a voltage difference of approximately 9V may occur between the word lines WL1 to WL32 and the channel in the erase inhibition strings In. ST. The voltage difference of approximately 9V may make it difficult to further reduce the threshold voltages of the memory cells that are completely erased. Therefore, an overerase operation of the memory cells that are completely erased may be prevented.

When all the strings in the selected memory block Sel. BLK pass the erase verification operation, the erase operation may be completed. When all the strings pass the erase verification operation, the memory cells, which are included in all the strings, may pass the erase verification operation.

While the erase operation is being performed on the selected memory block Sel. BLK, the unselected memory blocks Unsel. BLK may receive the erase voltage Verase or the erase inhibition voltage Vinh through the bit lines BL and the source lines SL. Therefore, in the unselected memory blocks Unsel.BLK, in order to prevent the strings Unsel. ST from being erased, the drain turn-on voltage Vdsl may be applied to all the drain selection lines DSL, the source turn-on voltage Vssl may be applied to the source selection lines SSL, and the erase prohibition voltage Vwl may be applied to the word lines WL1 to WL32.

The erase prohibition voltage Vwl may be set to the same voltage as the erase voltage Verase, i.e., 18V, or to be less than the drain and source turn-on voltages Vdsl and Vssl and greater than 0V. When the erase prohibition voltage Vwl is less than the drain and source turn-on voltages Vdsl and Vssl and greater than 0V, the erase prohibition voltage Vwl may be set to approximately 13.5V.

Since the erase prohibition voltage Vwl is being applied to the word lines WL1 to WL32, coupled to the unselected memory blocks Unsel. BLK, even when the erase voltage (e.g., a voltage of 18V) is applied to the bit lines BL, no voltage difference may occur between the word lines WL1 to WL32 and the channel. For example, when the erase prohibition voltage Vwl is the same as the erase voltage Verase, a voltage difference of 0V may occur between the word lines WL and the channel. As a result, the memory cells may not be erased. In addition, even when the erase prohibition voltage Vwl is set to approximately 13.5V as described above, a voltage difference of 4.5V may occur between the word lines WL1 to WL32 and the channel. The voltage difference of 4.5V may not allow the memory cells to be erased. Therefore, the memory cells may be prevented from being erased.

As described above, while the erase operation is being performed on the selected strings Sel. ST, since an overerase operation of the strings that are completely erased may be prevented, an increase in threshold voltage distribution width of memory cells may be prevented, and stress caused by an erase voltage that may be applied to unselected memory cells not to be programmed may be prevented.

According to the present invention, since resistance of strings during operations of a three-dimensional semiconductor device is reduced, disturbance may be prevented during a program operation, retention characteristics may be improved, reliability of a read operation may be improved, and erase stress may be reduced while an increase in threshold voltage distribution width is prevented.

What is claimed is:

1. A semiconductor device comprising:
   first memory blocks arranged in a longitudinal direction, and including a plurality of strings, wherein the strings are formed along a vertical direction, and the strings adjacent to each other share bit lines or source lines with each other, each string including a drain selection transistor coupled to an odd drain selection line or an even drain selection line, memory cells coupled to word lines, and a source selection transistor coupled to an odd source selection line or an even source selection line;
   page buffers suitable for storing data;
   a selection switch unit suitable for transferring the data stored in the page buffers or various voltages supplied from an external source to the bit lines and the source lines; and
   a control circuit suitable for controlling the page buffers and the selection switch unit.

2. The semiconductor device of claim 1, wherein the selection switch unit comprises:
   first switches coupled between a first voltage terminal and respective first nodes, and operating based on a first source line selection signal;
   second switches coupled between the respective first nodes and the respective page buffers, and operating based on a second source line selection signal;
   third switches coupled between a second terminal and respective second nodes, and operating based on a first bit line selection signal; and
   fourth switches coupled between the respective second nodes and the respective page buffers, and operating based on a second bit line selection signal.

3. The semiconductor device of claim 1, wherein the strings are arranged in a transverse direction and the longitudinal direction.

4. The semiconductor device of claim 3, wherein the strings arranged in the transverse direction include odd-numbered strings sharing the odd drain selection line and the odd source selection line, and even-numbered strings sharing the even drain selection line and the even source selection line, wherein the odd-numbered strings and the even-numbered strings share each of the word lines in each page.

5. The semiconductor device of claim 4, wherein the odd-numbered strings share the bit lines and do not share the source lines, and
   the even-numbered strings share the source lines and do not share the bit lines.

6. The semiconductor device of claim 3, wherein the strings arranged in the longitudinal direction are coupled to different odd drain selection lines or even drain selection lines, are coupled to different odd source selection lines or even source selection lines, and share each of the word lines in each page.

7. The semiconductor device of claim 1, further comprising:
   second memory blocks stacked over the respective first memory blocks in the vertical direction.

8. The semiconductor device of claim 7, wherein neighboring memory blocks stacked in the vertical direction share one of the bit lines and the source lines.

9. A semiconductor device comprising:
   memory blocks including a plurality of strings, wherein the strings are formed along a vertical direction and the strings adjacent to each other share bit lines or source lines, each string including a drain selection transistor coupled to an odd drain selection line or an even drain selection line, memory cells coupled to word lines, and a source selection transistor coupled to a source selection line;
   page buffers suitable for storing data;
   a selection switch unit suitable for transferring the data stored in the page buffers or various voltages supplied from an external source to the bit lines and the source lines; and
   a control circuit suitable for controlling the page buffers and the selection switch unit.

10. The semiconductor device of claim 9, wherein the strings are arranged in a transverse direction and a longitudinal direction,
    the strings arranged in the transverse direction include odd-numbered strings sharing the odd drain selection line and the odd source selection line, and even-numbered strings sharing the even drain selection line and the even source selection line, wherein the odd-numbered strings and the even-numbered strings share the word lines in each page, and
    the strings arranged in the longitudinal direction are coupled to different odd drain selection lines or even drain selection lines, are coupled to different source selection lines, and share the word lines in each page.

11. A method of operating a semiconductor device including a program method of a memory block including a plurality of strings, each having first memory cells and second memory cells coupled between source lines and bit lines, formed along a vertical direction, coupled to an odd drain selection line or an even drain selection line, and coupled to an odd source selection line or an even source selection line, the program method comprising:
    performing a first program operation sequentially on the first memory cells in a direction from the source lines to the bit lines; and
    performing a second program operation sequentially on the second memory cells in a direction from the bit lines to the source lines.

12. The method of claim 11, wherein the first memory cells are adjacent to the second memory cells from the source lines.

13. The method of claim 11, wherein during the first program operation, a program permission voltage or a program prohibition voltage is applied to the strings through the bit lines, a source turn-off voltage is applied to the odd and even source selection lines, and a drain turn-on voltage is applied to the odd or even drain selection line based on strings to be programmed, and during the second program operation, the program permission voltage or the program prohibition voltage is applied to the strings through the source lines, a drain turn-off voltage is applied to the odd and even drain selection lines, and a source turn-on voltage is applied to the odd or even source selection line based on strings to be programmed.

14. A method of operating a semiconductor device including a read method of a memory block including a plurality of strings, each having first memory cells and second memory cells coupled between source lines and bit lines, arranged in a vertical direction, coupled to an odd drain selection line or an even drain selection line, and coupled to an odd source selection line or an even source selection line, the read method comprising:

performing a first read operation sequentially on the first memory cells in a direction from the source lines to the bit lines; and performing a second read operation sequentially on the second memory cells in a direction from the bit lines to the source lines.

15. The method of claim 14, wherein the first memory cells are adjacent to the second memory cells from the source lines.

16. The method of claim 14, wherein during the first read operation, a precharge voltage is applied to the strings through the bit lines, the source lines are coupled to a ground terminal, and a drain turn-on voltage and a source turn-on voltage are applied to the odd drain selection line and the odd source selection line, respectively, or the drain turn-on voltage and the source turn-on voltage are applied to the even drain selection line and the even source selection line, respectively, based on strings to be read, and during the second read operation, the precharge voltage is applied to the strings through the source lines, the bit lines are coupled to a ground terminal, and the drain turn-on voltage and the source turn-on voltage are applied to the odd drain selection line and the odd source selection line, respectively, or the drain turn-on voltage and the source turn-on voltage are applied to the even drain selection line and the even source selection line, respectively, based on strings to be read.

17. A method of operating a semiconductor device including an erase method of a memory block including a plurality of strings, each having first memory cells and second memory cells coupled between source lines and bit lines, arranged in a vertical direction, coupled to an odd drain selection line or an even drain selection line, and coupled to an odd source selection line or an even source selection line, the erase method comprising:

performing an erase operation to erase memory cells, which are included in a selected memory block, by applying an erase voltage to the bit lines and the source lines coupled to the selected memory block, and applying an erase permission voltage to word lines coupled to the selected memory block;

performing an erase verification operation on the memory cells; and repeating the erase operation and the erase verification operation until the memory cells pass the erase verification operation while an erase inhibition voltage is applied to bit lines and source lines coupled to strings that are completely erased, among the bit lines and the source lines, based on a result of the erase verification operation.

18. The method of claim 17, further comprising:
applying an erase prohibition voltage to word lines coupled to unselected memory blocks.

19. The method of claim 18, wherein the erase prohibition voltage is equal to the erase voltage, or less than the erase voltage and greater than 0V.

20. The method of claim 17, wherein the erase inhibition voltage may correspond to approximately half of the erase voltage.

* * * * *